US012642131B2

(12) United States Patent
Chae et al.

(10) Patent No.: US 12,642,131 B2
(45) Date of Patent: May 26, 2026

(54) DISPLAY DEVICE AND METHOD OF PROVIDING THE SAME

(71) Applicant: Samsung Display Co., Ltd., Yongin-si (KR)

(72) Inventors: Seung-Yeon Chae, Hwaseong-si (KR); Seungwook Kwon, Hwaseong-si (KR); Woo Yong Sung, Seoul (KR); Seoyeon Lee, Namyangju-si (KR); Seunggun Chae, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 1014 days.

(21) Appl. No.: 17/740,422

(22) Filed: May 10, 2022

(65) Prior Publication Data

US 2023/0029503 A1 Feb. 2, 2023

(30) Foreign Application Priority Data

Aug. 2, 2021 (KR) ........................ 10-2021-0101440

(51) Int. Cl.
| | |
|---|---|
| *H01L 21/00* | (2006.01) |
| *H10W 42/00* | (2026.01) |
| *H10W 90/00* | (2026.01) |
| *H10P 72/70* | (2026.01) |
| *H10W 70/60* | (2026.01) |

(Continued)

(52) U.S. Cl.
CPC ........... *H10W 90/00* (2026.01); *H10W 42/00* (2026.01); *H10P 72/74* (2026.01); *H10P 72/7416* (2026.01); *H10P 72/7426* (2026.01);

*H10W 70/60* (2026.01); *H10W 70/654* (2026.01); *H10W 90/22* (2026.01)

(58) Field of Classification Search
CPC . H01L 25/167; H01L 23/564; H01L 21/6835; H01L 24/24; H01L 24/25; H01L 2221/68327; H01L 2221/6835; H01L 2224/24051; H01L 2224/24147; H01L 2224/25175; H01L 2924/12041; H10H 20/0362; H10H 20/853
See application file for complete search history.

(56) References Cited

U.S. PATENT DOCUMENTS

| | | |
|---|---|---|
| 9,530,826 B2 | 12/2016 | Kwon et al. |
| 10,153,460 B2 | 12/2018 | Isaka et al. |
| 10,347,866 B1 | 7/2019 | Kim |

(Continued)

FOREIGN PATENT DOCUMENTS

| | | |
|---|---|---|
| KR | 20140055608 A | 5/2014 |
| KR | 20180020091 A | 2/2018 |

(Continued)

*Primary Examiner* — Elmito Breval
(74) *Attorney, Agent, or Firm* — CANTOR COLBURN LLP

(57) ABSTRACT

A display device includes an active region, a pad region adjacent to the active region, a first peripheral region between the active region and the pad region, a second peripheral region outside the active region and spaced apart from the pad region, a base layer, a circuit layer on the base layer, a light-emitting element layer on the circuit layer and corresponding to the active region, a capping layer on the light-emitting element layer, a dam part extended along the active region and in the first peripheral region and the second peripheral region, and a protruding part outside the dam part in the second peripheral region and on the base layer.

8 Claims, 19 Drawing Sheets

(51) Int. Cl.
    *H10W 70/654*    (2026.01)
    *H10W 90/22*    (2026.01)

(56)        References Cited

U.S. PATENT DOCUMENTS

| | | |
|---|---|---|
| 10,916,722 B2 | 2/2021 | Park et al. |
| 11,152,595 B2 | 10/2021 | Jeon et al. |
| 11,800,757 B2 | 10/2023 | Kwon et al. |
| 2020/0368974 A1 | 11/2020 | Choung et al. |

FOREIGN PATENT DOCUMENTS

| | | |
|---|---|---|
| KR | 20190065757 A | 6/2019 |
| KR | 20190087694 A | 7/2019 |
| KR | 20190100568 A | 8/2019 |
| KR | 10-2036367 B1 | 10/2019 |
| KR | 20200032294 A | 3/2020 |
| KR | 1020200080889 A | 7/2020 |
| KR | 10-2169780 B1 | 10/2020 |
| KR | 1020200135264 A | 12/2020 |
| KR | 1020210052725 A | 5/2021 |
| KR | 20210085121 A | 7/2021 |

PDA-2
NDA2
DA
DM1
DM2
BMP-a

NDA1

NDA2

PDA-1
NDA1

DR2
DR1
DR3

Provide plurality of display panels on glass substrate —S10

Provide protective layer resin on each of display panels —S30

Provide ultraviolet light to form protective layer —S50

Provide laser light to detach display panels from glass substrate —S70

Cutting each of display panels —S80

Remove protective layer —S90

Provide light control layer —S110

DISPLAY DEVICE AND METHOD OF PROVIDING THE SAME

This application claims priority to Korean Patent Application No. 10-2021-0101440, filed on Aug. 2, 2021, and all the benefits accruing therefrom under 35 U.S.C. § 119, the entire contents of which are hereby incorporated by reference.

BACKGROUND

(1) Field

The present disclosure herein relates to a display device and a method of manufacturing (or providing) the display device. More particularly, the present disclosure relates to a method of manufacturing (or providing) the display device, the method including providing a protective layer during a manufacturing process, and a display device providing by using the manufacturing process.

(2) Description of the Related Art

A display device may be manufactured (or provided) through processes including forming a circuit layer including a thin film transistor and the like, a display element layer, and the like on a substrate. A protective film or the like is used to protect the display element layer during sequential manufacturing processes of the display device.

As the demand for display devices having various shapes has increased and there is a limit to protecting the display devices having various shapes with protective films owing to a limitation in processing the various shapes thereof, methods for effectively protecting the display devices during a display device manufacturing process are being studied.

SUMMARY

The present disclosure provides a method of manufacturing (or providing) a display device, the method effectively protecting display panels having various shapes during a manufacturing process.

The present disclosure also provides a display device from which a removable protective layer used to protect a display panel during a manufacturing process, may be easily removed.

An embodiment of the invention provides a display device including an active region, a pad region on at least one side of the active region, a first peripheral region between the active region and the pad region, a second peripheral region outside the active region and spaced apart from the pad region, a base layer, a circuit layer on the base layer, a light-emitting element layer on the circuit layer so as to correspond to the active region, a capping layer on the light-emitting element layer, a dam part extending along the active region and in the first peripheral region and the second peripheral region, and a protruding part outside the dam part in the second peripheral region and on the base layer.

In an embodiment, the circuit layer may include a thin film transistor and a plurality of insulating layers which are above the base layer, and the light-emitting element layer may include a plurality of barrier parts spaced apart from each other and a light-emitting element which is between the barrier parts.

In an embodiment, the protruding part may be on a same layer as any one of the plurality of insulating layers or as the barrier parts.

In an embodiment, the protruding part may be directly on the base layer.

In an embodiment, the dam part may be on a same layer as at least one of the plurality of insulating layers or as the barrier parts.

In an embodiment, the protruding part may contain polyimide.

In an embodiment, the active region may have a tetragonal shape on a plane, the pad region may be on one side of the active region, and the protruding part may surround the outside of the active region except for the one side on which the pad region is disposed.

In an embodiment, the protruding part may include a plurality of sub protruding parts spaced apart from each other.

In an embodiment, the active region may have a tetragonal shape on a plane, and the protruding part may correspond to a corner portion of the active region.

In an embodiment, the protruding part may include a first portion spaced apart from the dam part, and a second portion between the dam part and the first portion.

In an embodiment, the first portion may extend in a first direction parallel to an extension direction of the dam part, and the second portion may extend in a second direction different from the first direction and connect the first portion and the dam part to each other.

In an embodiment, the display device may further include a light control layer which is on the capping layer and includes quantum dots.

An embodiment of the invention provides a method of providing (or manufacturing) a display device, the method including forming a plurality of display panels on a glass substrate, providing a protective layer resin on each of the display panels, providing ultraviolet light from above the provided protective layer resin to form a protective layer, providing laser light from below the glass substrate to detach the display panels from the glass substrate, removing the protective layer, and providing a light control layer to each of the display panels from which the protective layer has been removed.

In an embodiment, the forming of the display panels may include providing a base layer including an active region, a pad region on at least one side of the active region, a first peripheral region between the active region and the pad region, and a second peripheral region outside the active region and spaced apart from the pad region, forming, on the base layer, a circuit layer including a thin film transistor and a plurality of insulating layers, forming, above the base layer, a dam part which surrounds the active region and corresponds to the first peripheral region and the second peripheral region, forming a protruding part outside the dam part in the second peripheral region and on the base layer, forming a light-emitting element layer on the circuit layer, and forming a capping layer on the light-emitting element layer.

In an embodiment, the providing of the protective layer resin may include providing the protective layer resin so that an edge of the provided protective layer resin is on the upper surface of the protruding part.

In an embodiment, the protective layer resin may contain an acrylic resin.

In an embodiment, the ultraviolet light may have a center wavelength of about 365 nanometers (nm) to about 395 nm.

In an embodiment, the forming of the protective layer may include a first curing of the provided protective layer resin to provisionally cure the protective layer resin, and a second curing of the provisionally cured protective layer resin to finally cure the protective layer resin.

In an embodiment, the removing of the protective layer may include inserting a detachment device between the upper surface of the protruding part and the protective layer to remove the protective layer.

In an embodiment, the method may include cutting each of display panels, between the detaching of the display panels from the glass substrate and the removing of the protective layer.

BRIEF DESCRIPTION OF THE FIGURES

The accompanying drawings are included to provide a further understanding of the invention, and are incorporated in and constitute a part of this specification. The drawings illustrate embodiments of the invention and, together with the description, serve to explain principles of the invention. In the drawings:

FIG. 7 is a cross-sectional view illustrating an embodiment of a portion of the display panel;

FIG. 9A is a plan view illustrating an embodiment of a display panel;

DETAILED DESCRIPTION

Figure 1:
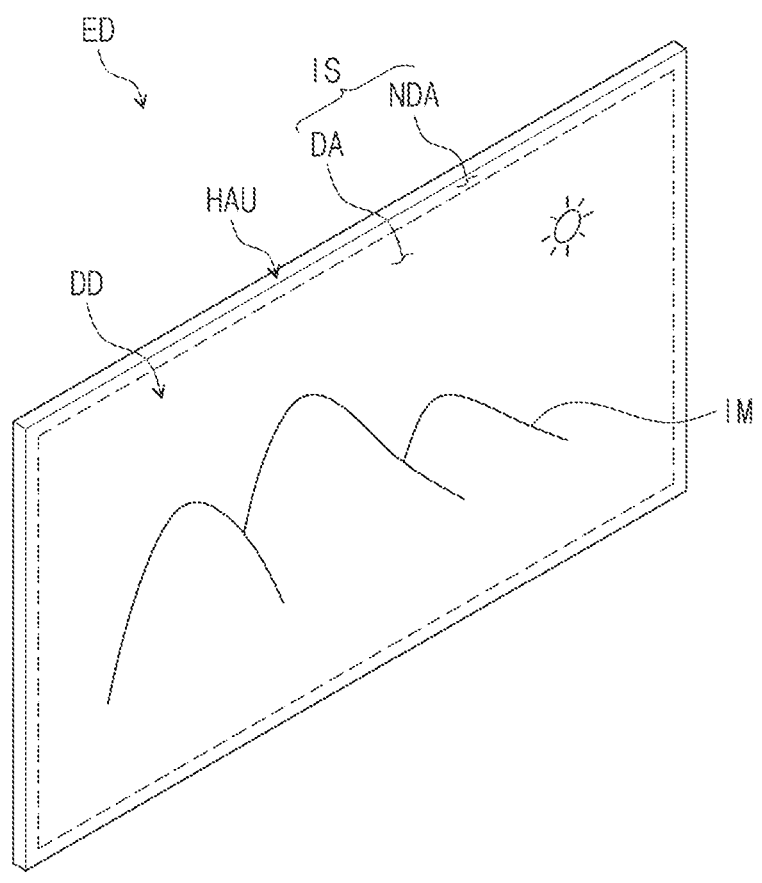
FIG. 1 is a perspective view of an embodiment of an electronic device.
Figure 1:
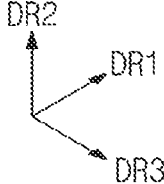

In the invention, various modifications can be made, various forms can be used, and embodiments will be illustrated in the drawings and described in detail in the text. However, this is not intended to limit the invention to a specific form disclosed, and it will be understood that all changes, equivalents, or substitutes which fall in the spirit and technical scope of the invention should be included.

In this specification, it will be understood that when an element (or region, layer, part, etc.) is referred to as being related to another element such as being "on", "connected to" or "coupled to" another element, it can be directly on, connected or coupled to the other element, or intervening elements may be present.

In contrast, in the present application, being related to another element such as being "directly disposed" may mean that there is no layer, film, region, plate, or the like added between a part such as a layer, film, region, or plate and another part such as a layer, film, region, or plate. For example, being "directly disposed" may mean that no additional member such as an adhesive member is disposed between two layers or two members. For example, being "directly disposed" may mean two elements form an interface therebetween.

Like reference numerals refer to like elements throughout. In addition, in the drawings, the thicknesses, ratios, and dimensions of elements are exaggerated for effective description of the technical contents.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations that the associated configurations can define.

It will be understood that, although the terms first, second, etc. may be used herein to describe various elements, these elements should not be limited by these terms. These terms are only used to distinguish one element from another element. For example, a first element could be termed a second element without departing from the scope of the invention. Similarly, the second element may also be referred to as the first element.

The terms of a singular form include plural forms unless otherwise specified. As used herein, a reference number may indicate a singular element or a plurality of the element. For example, a reference number labeling a singular form of an element within the drawing figures may be used to reference a plurality of the singular element within the text of specification.

In addition, terms, such as "below", "lower", "above", "upper" and the like, are used herein for ease of description to describe one element's relation to another element(s) as illustrated in the figures. The above terms are relative concepts and are described based on the directions indicated in the drawings. In this specification, being "disposed on" may mean being disposed not only on the upper portion of any one member but also on the lower portion thereof.

It will be understood that the terms "include" and/or "have", when used in this specification, specify the presence of stated features, integers, steps, operations, elements, components and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, an embodiment of a display device DD and a method of manufacturing (or providing) the display device DD will be described with reference to the accompanying drawings.

FIG. 1 is a perspective view illustrating an embodiment of an electronic device ED. The electronic device ED may be activated or operated according to an electrical signal.

FIG. 1 exemplarily illustrates that the electronic device ED is a television. However, the electronic device ED may be used not only as a large electronic device such as a monitor or an outdoor billboard, but also as a small- or medium-sized electronic device such as a personal computer, a notebook computer, a personal digital terminal, a car navigation unit, a game console, a smartphone, a tablet, and a camera. In addition, the electronic devices listed above are presented as examples only, and the electronic device ED may be employed in other electronic devices without departing from the concept of the invention.

The electronic device ED may include a display device DD and a housing HAU. The housing HAU may receive and/or accommodate the display device DD. The housing HAU may be disposed to cover outer surfaces of the display device DD so that the upper surface of the display device DD, which is a display surface IS, is exposed to outside the electronic device ED. The housing HAU may cover outer surfaces at the side and lower surfaces of the display device DD and expose an entirety of the upper surface thereof. However, the embodiment is not limited thereto, and the housing HAU may cover a portion of the upper surface of the display device DD as well as the side and lower surfaces thereof.

FIG. 1 and the following drawings illustrate a first direction axis DR1, a second direction axis and a third direction axis DR3 crossing each other. The first to third direction axes DR1, DR2 and DR3 described herein are relative concepts and therefore may be converted into other directions. In addition, directions indicated by the first to third direction axes DR1, DR2, and DR3 may be described as first to third directions, and the same reference numerals may be used for the directions. In this specification, the first direction axis DR1 and the second direction axis DR2 may cross each other such as to be perpendicular to each other, and the third direction axis DR3 may be a direction normal to a plane defined by the first direction axis DR1 and the second direction axis DR2 which cross each other.

In this specification, the thickness direction of the electronic device ED or the display device DD may be parallel to the third direction axis DR3 that is a direction normal to a plane defined by the first direction axis DR1 and the second direction axis DR2. In this specification, the front surfaces (or upper surfaces) and the rear surfaces (or lower surfaces) of the members constituting the display device DD may be defined based on the third direction axis DR3.

FIG. 1 illustrates that the display surface IS of the electronic device ED is parallel to a surface defined by the first direction axis DR1 and the second direction axis DR2 which crosses the first direction axis DR1. However, this is only an example, and in an embodiment, the display surface IS of the electronic device ED may have a curved shape.

The display device DD may include an active region DA and a peripheral region NDA which is adjacent to the active region DA. The active region DA corresponds to a portion in which an image IM is displayed. The active region DA may be referred to as a display region. The peripheral region NDA may not display an image IM and may be referred to as a non-display region, without being limited thereto. Various components and layers of the electronic device ED and/or the display device DD may have an active region DA and a peripheral region NDA corresponding to those described above.

In an embodiment, the active region DA may have a tetragonal shape on a plane (e.g., in a plan view along the third direction). The peripheral region NDA may be adjacent to the active region DA, such as to surround the active region DA. However, the invention is not limited thereto, and the shape of the active region DA and the shape of the peripheral region NDA may be relatively designed. In an embodiment, for example, the active region DA may have a circular shape, an oval shape, a shape having a curved portion at least in part, or a polygonal shape when viewed on a plane.

In an embodiment, the active region DA may include or be parallel to a plane defined by, the first direction axis DR1 and the second direction axis DR2. Unlike what is illustrated in FIG. 1 and the like, the active region DA may further include a curved surface bent in at least one direction from a plane defined by the first directional axis DR1 and the second directional axis DR2.

The peripheral region NDA may have a shape (e.g., planar shape) corresponding to the shape of the active region DA, or a shape surrounding the active region DA and corresponding to the shape of the electronic device ED. That is, the display device DD according to an embodiment is not limited to the shape illustrated in FIG. 1 and the like, and may have various shapes.

Figure 2:
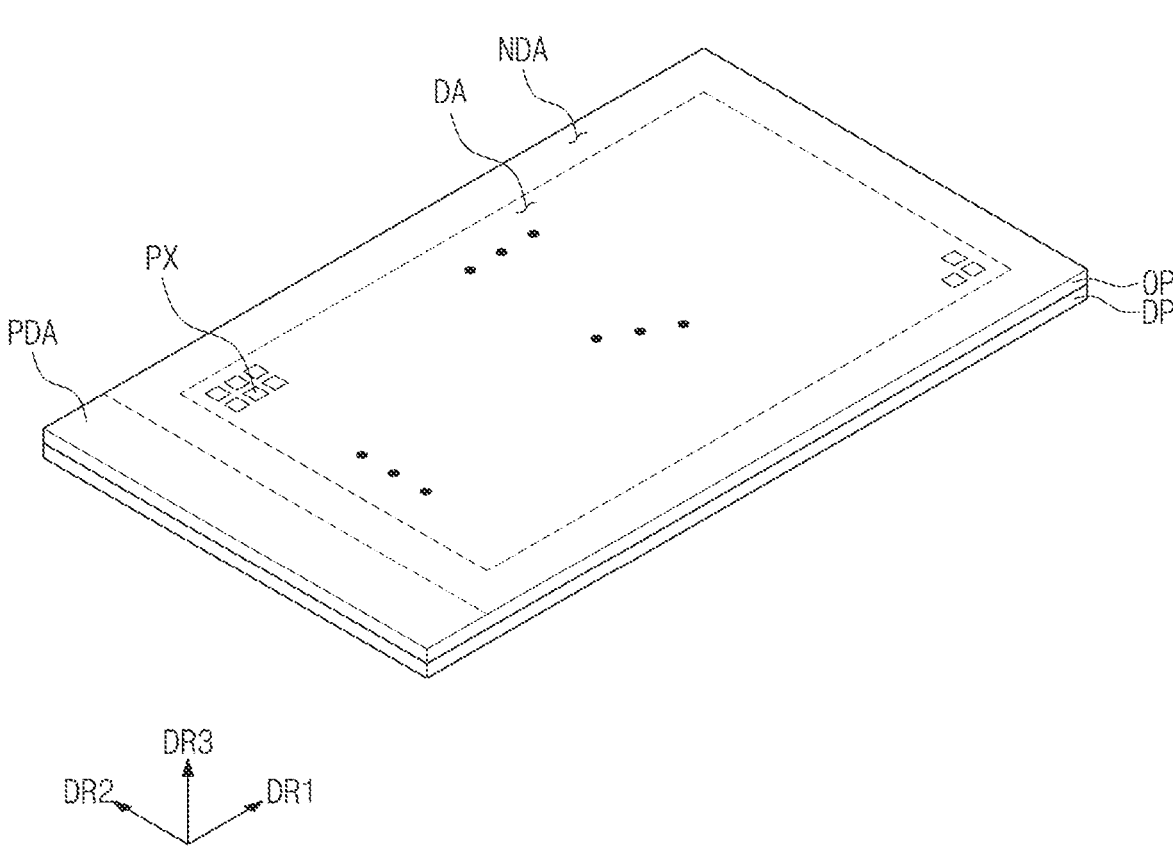
FIG. 2 is a perspective view of an embodiment of a display device.

FIG. 2 is a perspective view of an embodiment of a display device DD. The display device DD may include a display panel DP and a light control panel OP.

In an embodiment, the display panel DP may be a subminiature light-emitting element display panel DP including a subminiature light-emitting element. In an embodiment, for example, the display panel DP may be a micro light emitting diode ("LED") display panel DP. However, the invention is not limited thereto, and in an embodiment, the display panel DP may include a self-light-emitting-type light-emitting element, for example, an organic electroluminescent element.

The display panel DP may include a pixel PX provided in plural including a plurality of pixels PX. Each of the pixels PX may include a light-emitting element LD and a pixel circuit PXC which is electrically connected to the light-emitting element LD. The pixel circuit PXC may include a plurality of transistors.

The pixels PX may be arranged along the plane of the display panel DP. Each of the pixels PX may display one of primary colors or one of mixed colors. The primary colors may include red, green, and blue, and the mixed colors may include various colors such as yellow, cyan, magenta, and white. However, the colors, which are displayed by the pixels PX, are not limited thereto.

Figure 4A:
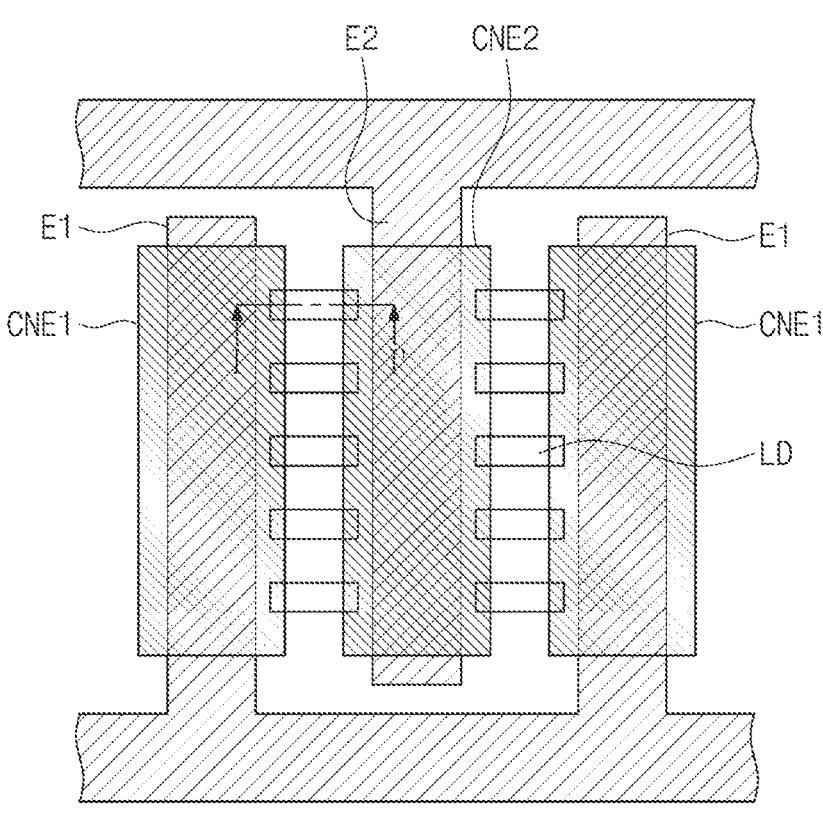
FIG. 4A is a plan view illustrating an embodiment of a portion of the display device.
Figure 4A:
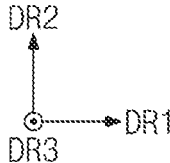
Figure 4B:
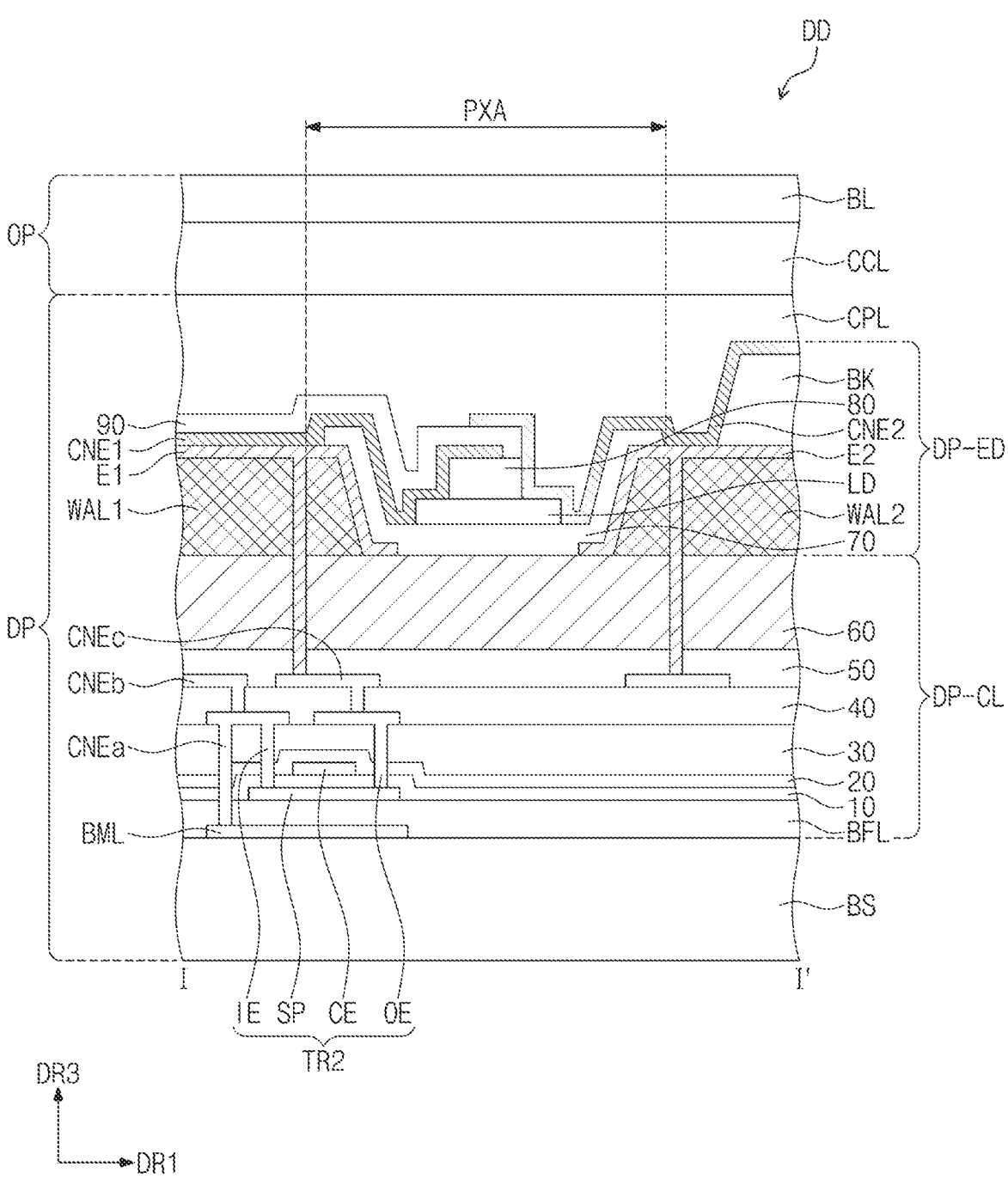
FIG. 4B is a cross-sectional view illustrating an embodiment of a portion of the display device.

The light control panel OP disposed on the display panel DP may include a light control layer CCL (see FIG. 4B). In addition, a filling layer (not illustrated) may be further disposed between the display panel DP and the light control panel OP. The filling layer may connect the display panel DP to the light control panel OP. In addition, the filling layer may function as a buffer between the display panel DP and the light control panel OP.

Figure 3:
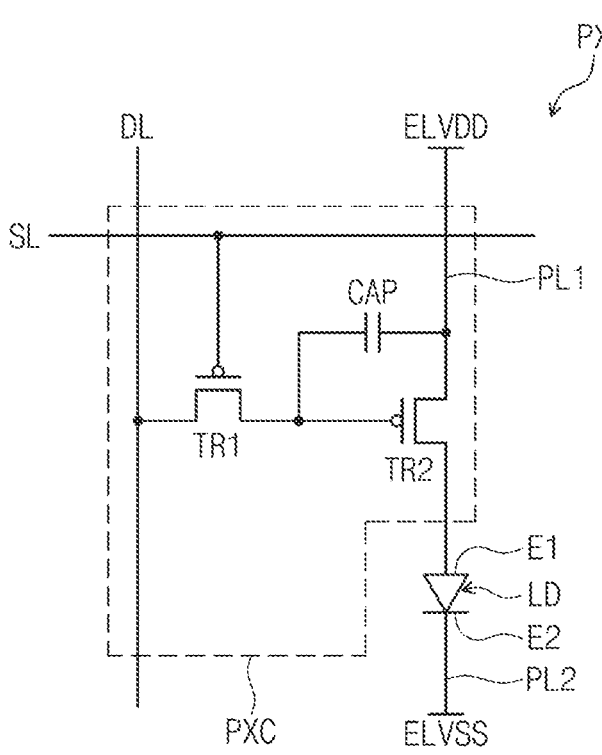
FIG. 3 is an equivalent circuit diagram of an embodiment of a pixel of a display device.

FIG. 3 is an equivalent circuit diagram of an embodiment of a pixel PX. FIG. 3 is an equivalent circuit diagram of one pixel PX among the plurality of pixels PX illustrated in FIG. 2.

Referring to FIG. 3, the pixel PX may be connected to a plurality of signal lines. The embodiment illustrated in FIG. 3 exemplarily illustrates a scan line SL, a data line DL, a first power line PL1, and a second power line PL2 among the signal lines. However, this is illustrated as an example, and the pixel PX may be additionally connected to various signal lines, while the invention is not limited thereto.

The pixel PX may include a light-emitting element LD, a first electrode E1, a second electrode E2, and a pixel circuit PXC. The pixel circuit PXC may include a first thin film transistor TR1, a capacitor CAP, and a second thin film transistor TR2. This is illustrated only as an example, and the number of thin film transistors and capacitors included in the pixel circuit PXC is not limited to that illustrated in FIG. 3. In an embodiment, for example, the pixel circuit PXC may include seven thin film transistors and one capacitor.

The first thin film transistor TR1 may be a switching transistor that controls an ON-OFF operation of the pixel PX. The first thin film transistor TR1 may transmit or block a data signal transmitted through the data line DL in response to a scan signal transmitted through the scan line SL.

The capacitor CAP is connected to the first thin film transistor TR1 and the first power line PL1. The capacitor CAP stores a quantity of electrical charge corresponding to a difference between the data signal transmitted from the first thin film transistor TR1 and a first power voltage ELVDD applied to the first power line PL1.

The second thin film transistor TR2 is connected to the first thin film transistor TR1, the capacitor CAP, and the light-emitting element LD. The second thin film transistor TR2 controls a driving current (e.g., electrical current) flowing through the light-emitting element LD in response to a quantity of electrical charge stored in the capacitor CAP. The turn-on time of the second thin film transistor TR2 may be determined according to a quantity of electrical charge stored in the capacitor CAP.

The first thin film transistor TR1 and the second thin film transistor TR2 may be an n-type thin film transistor or a p-type thin film transistor. In addition, in another embodiment, at least one of the first thin film transistor TR1 or the second thin film transistor TR2 may be an n-type thin film transistor and the other may be a p-type thin film transistor.

The light-emitting element LD is connected to the second thin film transistor TR2 and the second power line PL2. In an embodiment, for example, the light-emitting element LD may be connected to the first electrode E1 electrically connected to the second thin film transistor TR2, and the second electrode E2 connected to the second power line PL2. The first electrode E1 is electrically connected to the pixel circuit PXC, and the second electrode E2 may receive a power voltage, for example, a second power voltage ELVSS through the second power line PL2.

The light-emitting element LD emits light with a voltage corresponding to a difference between a signal transmitted through the second thin film transistor TR2 and the second power voltage ELVSS received through the second power line PL2.

The light-emitting element LD may be a subminiature LED element. The subminiature LED element may be an LED element having a length between several nanometers and several hundreds of micrometers. However, the length of the subminiature LED element is described only as an example, and the length of the subminiature LED element is not limited to the above numerical range.

FIG. 3 exemplarily illustrates that one of the light-emitting element LD is connected between the second thin film transistor TR2 and the second power line PL2, but a plurality of light-emitting elements LD may be provided. The plurality of light-emitting elements LD may be connected to each other in parallel.

FIG. 4A is an enlarged plan view of an embodiment of the display device DD. FIG. 4B is an enlarged cross-sectional view of the display device DD. For ease of description, FIG. 4B illustrates a portion of the display device DD including a pixel region PXA corresponding to one pixel, and some components are omitted without illustration. FIG. 4B may be a cross-sectional view of a portion corresponding to line I-I' in FIG. 4A.

Referring to FIGS. 4A and 4B, the display device DD may include a display panel DP and a light control panel OP which faces the display panel DP such as to be disposed on the display panel DP. The display panel DP may include a base layer BS, a circuit layer DP-CL disposed on the base layer BS, a light-emitting element layer DP-ED disposed on the circuit layer DP-CL, and a capping layer CPL disposed on the light-emitting element layer DP-ED. That is, the display panel DP includes in order from the base layer BS, a circuit layer DP-CL, a light-emitting element layer DP-ED which is connected to the circuit layer DP-Cl, and the capping layer CPL.

In the display panel DP, the base layer BS may be a member that provides a base surface on which the light-emitting element layer DP-ED is disposed. The base layer BS may be a stacked structure including a plastic substrate, an insulating film, or a plurality of insulating layers. The base layer BS may have a multi-layered structure. In an embodiment, for example, the base layer BS may have a three-layer structure of a polymer resin layer, a barrier layer, and a polymer resin layer. In particular, the polymer resin layer may contain a polyimide-based resin. In addition, the base layer BS may be a support layer formed of (or including) polyimide as a single layer.

The circuit layer DP-CL may be disposed on the base layer BS. The circuit layer DP-CL may include an insulating layer, a semiconductor pattern, a conductive pattern, a signal line, and the like. An insulating layer, a semiconductor layer, and a conductive layer may be formed on the base layer BS by coating, deposition, or the like, and then the insulating layer, the semiconductor layer, and the conductive layer may be selectively patterned through a plurality of photolithography processes. Thereafter, the semiconductor pattern, the conductive pattern, and the signal line included in the circuit layer DP-CL may be formed.

The circuit layer DP-CL may include a thin film transistor and a plurality of insulating layers which are disposed above the base layer BS. In addition, the circuit layer DP-CL may include a plurality of connection electrode parts formed to pass through the plurality of insulating layers.

A lower shielding pattern BML may be disposed on the base layer BS. Although not illustrated, a buffer layer may be further disposed between the base layer BS and the lower shielding pattern BML. The lower shielding pattern BML may overlap (or correspond to) the thin film transistor TR2. By overlapping the semiconductor pattern SP, the lower shielding pattern BML may serve as a protective layer that prevents (or reduces) the electrical characteristics of the semiconductor pattern SP from being deteriorated.

A buffer layer BFL may be disposed on the base layer BS. The buffer layer BFL may cover the lower shielding pattern BML. The first thin film transistor TR1 (see FIG. 3) and the second thin film transistor TR2 may be disposed on the buffer layer BFL. Although only the second thin film transistor TR2 included in the circuit layer DP-CL is illustrated in the cross-sectional view of FIG. 4B, the circuit layer DP-CL may include the first thin film transistor TR1 (see FIG. 3) including a first control electrode, a first input electrode, a first output electrode, and a first semiconductor pattern. In addition, the description of the configuration of the second thin film transistor TR2 to be given later may be equally applied to the stack positions of the first control electrode, the first input electrode, the first output electrode, and the first semiconductor pattern of the first thin film transistor TR1.

The second thin film transistor TR2 may include a second control electrode CE, a second input electrode IE, a second output electrode OE, and a second semiconductor pattern SP. The second semiconductor pattern SP may be disposed on the buffer layer BFL. The buffer layer BFL may provide a modified surface to the second semiconductor pattern SP. In this case, the second semiconductor pattern SP which forms an interface with the buffer layer BH, may have higher adhesion to the buffer layer BFL than when formed directly on the base layer BS to form an interface therewith. Alternatively, the buffer layer BFL may be a barrier layer that protects the lower surface of the second semiconductor pattern SP or the like. In this case, the buffer layer BFL may block the base layer BS, or pollutants, moisture, or the like, which may be introduced through the base layer BS, from penetrating into the second semiconductor pattern SP and the like.

A first insulating layer 10 may be disposed on the buffer layer BFL so as to cover the second semiconductor pattern SP. The first insulating layer 10 may contain (or include) an inorganic material. The first insulating layer 10 may contain, for example, silicon nitride, silicon oxynitride, silicon oxide, titanium oxide, aluminum oxide, or the like, but the invention is not limited thereto.

The second control electrode CE may be disposed on the first insulating layer 10. A second insulating layer 20 may be disposed on the first insulating layer 10 so as to cover the second control electrode CE. The second insulating layer 20 may contain an inorganic material.

A third insulating layer 30 may be disposed on the second insulating layer 20. The second input electrode IE and the second output electrode OE may be disposed on the third insulating layer 30. The second input electrode IE and the second output electrode OE may be connected to the second semiconductor pattern SP through through-holes passing through the first to third insulating layers 10, 20, and 30. On the third insulating layer 30, at least a portion of each of signal lines, for example, scan lines or data lines as well as the second input electrode IE and the second output electrode OE, may be disposed.

The second input electrode IE and the lower shielding pattern BTL may be electrically connected to each other through a first connection electrode part CNEa among a plurality of connection electrode parts which is disposed in a through-hole passing through the buffer layer BFL and each of the first to third insulating layers 10, 20 and 30.

A fourth insulating layer 40 may be disposed on the third insulating layer 30 so as to cover the second input electrode IE and the second output electrode OE. The fourth insulating layer 40 may be a single layer or a plurality of layers, and the fourth insulating layer 40 may contain an organic material and/or an inorganic material.

Second and third connection CNEb and CNEc may be disposed on the fourth insulating layer 40. On the fourth insulating layer 40, at least another portion of each of signal lines, for example, scan lines or data lines as well as the second and third connection electrode parts CNEb and CNEc, may be disposed. The second and third connection electrode parts CNEb and CNEc may pass through the fourth insulating layer 40 so as to be connected to the second input electrode IE or the second output electrode OE.

A fifth insulating layer 50 may be disposed on the fourth insulating layer 40 so as to cover the second and third connection electrode parts CNEb and CNEc. The fifth insulating layer 50 may contain an organic material and/or an inorganic material.

A sixth insulating layer 60 may be disposed on the fifth insulating layer 50. The sixth insulating layer 60 may contain an organic material. In an embodiment, for example, the sixth insulating layer 60 may be formed with polyimide. The sixth insulating layer 60 may cover the pixel circuit PXC (refer to FIG. 3) disposed below and provide a flat surface at least in part. In an embodiment, for example, the sixth insulating layer 60 may provide a flat surface on which the light-emitting element layer DP-ED is provided.

A plurality of barrier parts WAL1 and WAL2 may be disposed on the sixth insulating layer 60. In an embodiment, for example, a first barrier part WAL1 and a second barrier part WAL2 which are spaced apart from each other in a direction along the base layer BS, may be disposed on the sixth insulating layer 60. The first barrier part WAL1 and the second barrier part WAL2 may be spaced apart from each other along the first direction axis DR1. Each of the first barrier part WAL1 and the second barrier part WAL2 may contain an organic material. In an embodiment, for example, the plurality of barrier parts WAL1 and WAL2 may be formed with polyimide.

The first electrode E1 may cover the first barrier part WAL1 and the second electrode E2 may cover the second barrier part WAL2. That is, the first barrier part WAL1 may be disposed between the first electrode E1 and the sixth insulating layer 60, and the second barrier part WAL2 may be disposed between the second electrode E2 and the sixth insulating layer 60.

A first through-hole passing through the sixth insulating layer 60 and the first barrier part WAL1 may be provided, and the first electrode E1 may be electrically connected to the connection electrode part CNEc through the first through-hole. In addition, the second electrode E2 may be electrically connected to the circuit layer DP-CL through a second through-hole passing through the sixth insulating layer 60 and the second barrier part WAL2. Although not illustrated, the second electrode E2 may be electrically connected to the second power line PL2 (refer to FIG. 3). That is, the second power voltage ELVSS (refer to FIG. 3) may be provided to the second electrode E2.

Each of the first electrode E1 and the second electrode E2 may have a stack structure in which one electrode layer or a plurality of electrode layers are stacked. In an embodiment, for example, the first electrode E1 and the second electrode E2 may include a reflective electrode and a capping electrode, respectively. Each of the first electrode E1 and the second electrode E2 may have a structure in which indium tin oxide (ITO), silver (Ag), and indium tin oxide (ITO) are sequentially stacked. In addition, the first electrode E1 and the second electrode E2 may include at least any one of indium zinc oxide (IZO), indium gallium oxide (IGO), indium zinc gallium oxide (IZGO), or a mixture/compound thereof.

On a plane (e.g., along the first direction axis DR1 and/or the second direction axis DR2), a seventh insulating layer 70 may be disposed between the first electrode E1 and the second electrode E2. The seventh insulating layer 70 may contain an inorganic material. The seventh insulating layer 70 may be disposed on an exposed portion of the sixth insulating layer 60 which is exposed to outside the plurality of barrier parts WAL1 and WAL2 at a location between the first electrode E1 and the second electrode E2. The seventh insulating layer 70 may be disposed to partially overlap the first electrode E1 and the second electrode E2 respectively disposed on the barrier parts WAL1 and WAL2.

A light-emitting element LD is disposed on the seventh insulating layer 70. The light-emitting element LD may be disposed between the first electrode E1 and the second electrode E2 in a direction along the sixth insulating layer 60. The light-emitting element LD may be electrically connected to the first electrode E1 and the second electrode E2.

The light-emitting element LD may include an n-type semiconductor layer, a p-type semiconductor layer, and an active layer disposed between the n-type semiconductor layer and the p-type semiconductor layer. The light-emitting element LD may have various shapes such as a cylindrical shape or a polygonal pillar shape. In the light-emitting element LD, the n-type semiconductor layer may be connected to any one of the first electrode E1 and the second electrode E2, and the p-type semiconductor layer may be connected to the other one thereof. The active layer may be formed of at least one of a single quantum well structure, a multiple quantum well structure, a quantum wire structure, or a quantum dot structure. The active layer may be a region in which electrons injected through the n-type semiconductor layer and holes injected through the p-type semiconductor layer are recombined.

Referring to FIG. 4A, in one or more embodiment of the display device DD, each of the first electrode E1 and the second electrode E2 may extend along the second direction axis DR2, and the first electrode E1 and the second electrodes E2 may be spaced apart from each other along the first direction axis DR1. FIG. 4A is illustrated only as an example, and the invention is not limited thereto. The first electrode E1 and the second electrode E2 only need to be spaced apart from each other and may be modified into various structures. FIG. 4A exemplarily illustrates a structure in which two first electrodes E1 are provided relative to a single one of the second electrode E2 which is interposed therebetween and extends along the second direction axis DR2.

On a plane, the light-emitting element LD may be disposed between the first electrode E1 and the second electrode E2, and the light-emitting element LD may not overlap the first electrode E1 and the second electrode E2 (e.g., may be spaced apart from the electrodes). A plurality of light-emitting elements LD may be provided, and the plurality of light-emitting elements LD may be connected in parallel to each other. The light-emitting element LD may be electrically connected to the first electrode E1 by a first connection electrode CNE1 and to the second electrode E2 by a second connection electrode CNE2.

Referring again to FIG. 4B, an eighth insulating layer 80 (or an insulating pattern) may be disposed on the light-emitting element LD. The eighth insulating layer 80 may cover at least a portion of the upper surface of the light-emitting element LD. A ninth insulating layer 90 may be disposed on the first connection electrode CNE1.

The second connection electrode CNE2 may be disposed on the light-emitting element LD and the second electrode E2. The second connection electrode CNE2 may be spaced apart from the first connection electrode CNE1 with the ninth insulating layer 90 interposed therebetween. That is, the first connection electrode CNE1 and the second connection electrode CNE2 may not be in direct contact with each other due to the ninth insulating layer 90.

The second connection electrode CNE2 may be disposed on the seventh insulating layer 70 and the second barrier part WAL2. In addition, in an embodiment, the display panel DP may further include a bank BK disposed on the second barrier part WAL2. The bank BK may serve as a separation membrane that prevents color light emitted from adjacent pixels from being mixed with each other. In an embodiment, the bank BK may be omitted.

In an embodiment, the second connection electrode CNE2 may be provided to overlap the seventh insulating layer 70, the second barrier part WAL2, and the bank BK disposed above the second barrier part WAL2. However, the invention is not limited thereto.

The first connection electrode CNE1 and the second connection electrode CNE2 may contain a conductive material. In an embodiment, for example, the conductive material may include at least one of indium zinc oxide (IZO), indium tin oxide (ITO), indium gallium oxide (IGO), indium zinc gallium oxide (IZGO), or a mixture/compound thereof. However, the invention is not limited thereto. In embodiment, for example, the conductive material may be a metallic material, and the metallic material may include, for example, molybdenum, silver, titanium, copper, aluminum, or an alloy thereof.

The capping layer CPL may be disposed on the second connection electrode CNE2 and the ninth insulating layer 90. The capping layer CPL may serve as an encapsulation layer for protecting the light-emitting element LD, the first electrode E1, the second electrode E2, the first connection electrode CNE1, and the second connection electrode CNE2. The capping layer CPL may fill a space between the display panel DP and the light control panel OP and couple the display panel DP and the light control panel OP to each other. The capping layer CPL may be an organic layer and be formed of a polymer resin.

The light control panel OP may include a base substrate BL and a light control layer CCL. The light control layer CCL may include a light converter. The light converter may be a quantum dot, a phosphor, or the like. The light converter may convert the wavelength of received light and emit converted light. In an embodiment, the light control layer CCL may contain a quantum dot or a phosphor.

The light control layer CCL may include a plurality of light control elements. In addition, the light control layer CCL may include light control elements spaced apart from each other and a partition pattern which is disposed between the light control elements spaced apart from each other.

The light converter included in the light control layer CCL may absorb a first light provided from the light-emitting element LD, convert the wavelength of the first light, and emit a second light having a color different from that of the first light (e.g., color-convert the first light as received light). In an embodiment, for example, the light converter may be a quantum dot. The first light may be blue light, and the second light may be green light or red light. However, this is exemplary and the invention is not limited thereto. In addition, in another embodiment, the light control layer CCL may be replaced with a color filter, or the light control panel OP may further include a color filter in addition to the light control layer CCL. The color filter may produce a color by absorbing light having a wavelength. In addition, unlike what is illustrated, the light control layer CCL may be omitted in the display device DD. In this case, light-emitting element LD may emit blue light, green light, or red light at the pixel region PXA, respectively. The pixel region PXA may be an emission area at which light is emitted from the pixel PX (e.g., light emission area).

In an embodiment, the light control panel OP may include a base substrate BL facing the display panel DP with the light control layer CCL therebetween. The base substrate BL may be a member that provides a base surface on which the light control layer CCL or the like is disposed. The base substrate BL may be a glass substrate, a metal substrate, a plastic substrate, or the like. However, the invention is not limited thereto, and the base substrate BL may be an inorganic layer, an organic layer, or a composite material layer. In addition, unlike what is illustrated, in an embodiment, the base substrate BL may be omitted.

Figure 5:
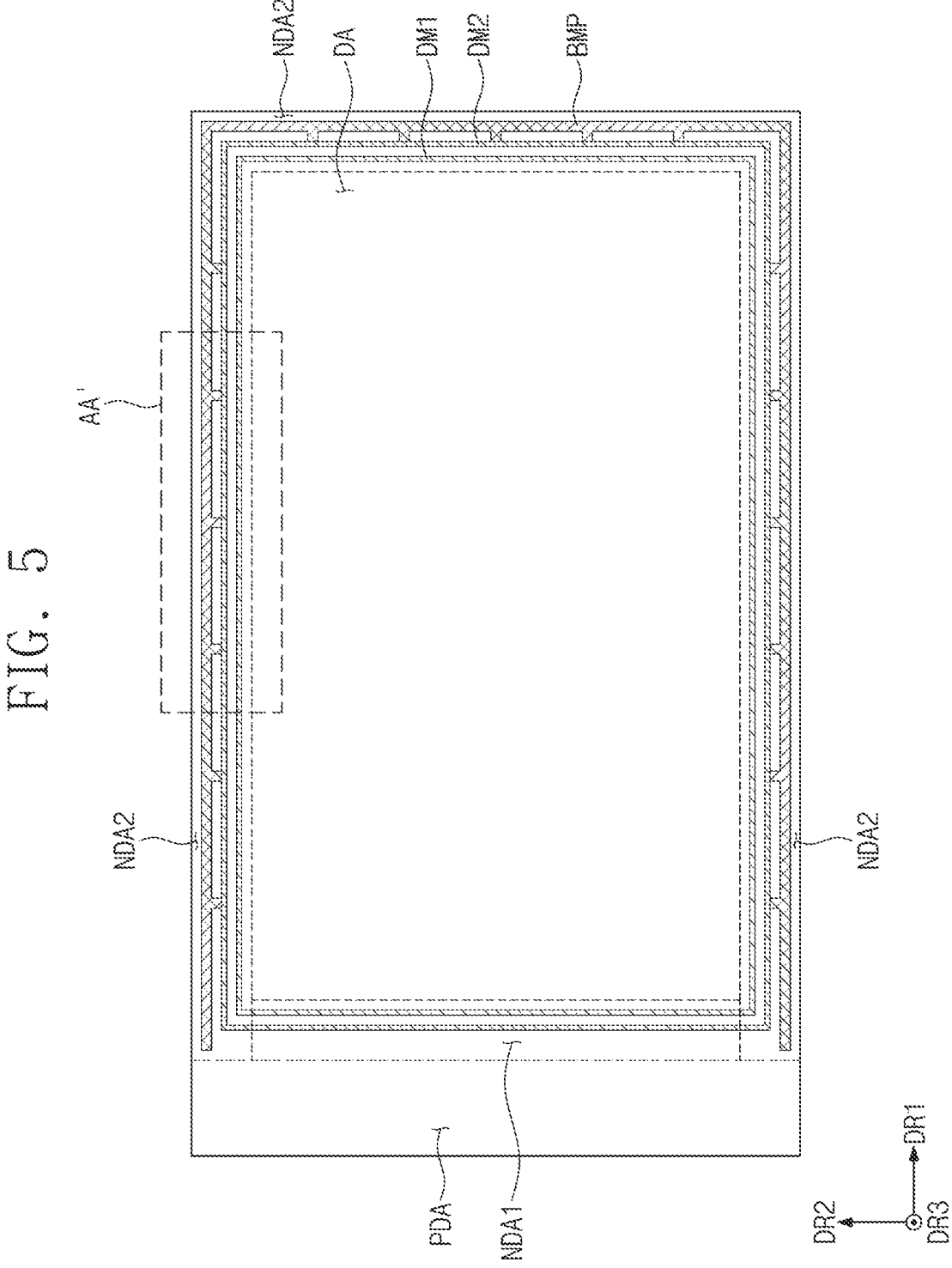
FIG. 5 is a plan view illustrating an embodiment of a display panel.
Figure 6:
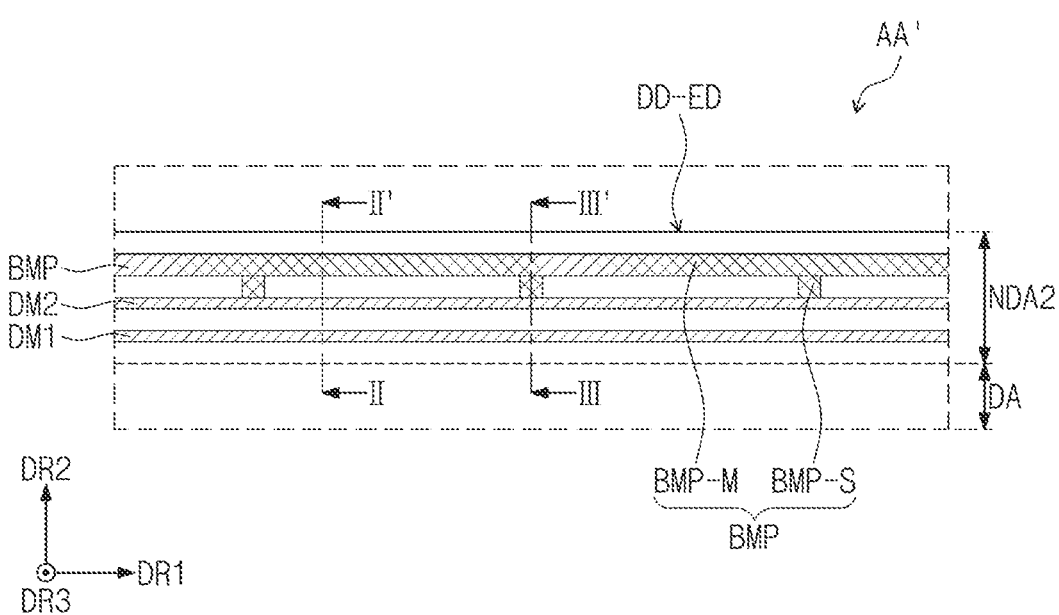
FIG. 6 is a plan view illustrating an embodiment of a portion of the display panel.

FIG. 5 is a plan view illustrating an embodiment of a display panel DP, which is included in a display device DD. FIG. 6 is a plan view illustrating an embodiment of a portion of the display panel DP. FIG. 6 is an enlarged plan view illustrating region AA' of FIG. 5.

Referring to FIGS. 5 and 6, the display panel DP may include an active region DA, peripheral regions NDA1 and NDA2, and a pad region PDA. The active region DA may be a display region in which an image IM (see FIG. 1) is displayed. The peripheral regions NDA1 and NDA2 may be regions adjacent to the active region DA, such as surrounding the active region DA.

The pad region PDA may be disposed on at least one side of the active region DA. In the pad region PDA, a pad portion (e.g., pad PD in FIG. 9B) connected to a data driver, a scan driver, a signal controller, and the like, and connecting lines (e.g., line WL in FIG. 9B) variously connected to such drivers and controllers, may be disposed for controlling the operation of the display panel DP.

Referring to FIG. 5, in the display panel DP, the pad region PDA may be disposed at only one side of the active region DA. However, the invention is not limited thereto, and in an embodiment, the pad region PDA may be additionally disposed in another portion adjacent to the active region DA. In addition, the display panel DP may include a first peripheral region NDA1 disposed between the active region DA and the pad region PDA, and a second peripheral region NDA2 disposed outside the active region DA and spaced apart from the pad region PDA. In this specification, the second peripheral region NDA2 may refer to a remainder of the peripheral region NDA other than the first peripheral region NDA1 disposed between the pad region PDA and the active region DA. In an embodiment, the second peripheral region NDA2 may refer to a remainder of the peripheral region NDA other than the first peripheral region NDA1 and the pad region PDA. That is, the pad region PDA may be a portion of an overall peripheral region NDA, without being limited thereto.

The display panel DP may include dam parts DM1 and DM2 disposed in the first peripheral region NDA1 and the second peripheral region NDA2, so as to extend along a boundary of the active region DA such as to surround the outside of the active region DA. The dam parts DM1 and DM2 may serve to control the flow of the capping layer CPL (see FIG. 4B) of the display panel. The dam parts DM1 and DM2 may serve as a blocking layer that prevents a polymer resin used to form the capping layer CPL (see FIG. 4B) from flowing in a direction away from the active region DA to an outer edge of the display panel DP.

The dam parts DM1 and DM2 may be formed in the same process as that of forming a portion of the circuit layer DP-CL (see FIG. 4B) or a portion of the light-emitting element layer DP-ED described with reference to FIG. 4B. In an embodiment, for example, the dam parts DM1 and DM2 may be formed in the same process as that of forming the sixth insulating layer 60 (see FIG. 4B) or in the same process as that of forming the barrier parts WAL1 and WAL2 (see FIG. 4B). As used herein, elements provided in a same process may be respective patterns of a same material layer, may be on a same layer as each other, may be in a same layer as each other, etc., without being limited thereto.

In addition, when the dam parts DM1 and DM2 have a structure in which two or more layers are stacked, the dam parts DM1 and DM2 may be provided in a form in which a layer formed in the same process as that of forming the sixth insulating layer 60 (see FIG. 4B) and a layer formed in the same process as that of forming the barrier parts WAL1 and WAL2 (see FIG. 4B) are stacked. The dam parts DM1 and DM2 may have a structure of a single organic layer, a stack structure of a plurality of organic layers, or a stack structure of an organic layer and an inorganic layer. In an embodiment, for example, the dam parts DM1 and DM2 may be formed with polyimide.

Referring to the embodiment in FIG. 5, the display panel DP is illustrated to include a first dam part DM1 (e.g., first dam) surrounding the active region DA and a second dam part DM2 (e.g., second dam) disposed outside the first dam part DM1 (e.g., closer to the outer edge of the display panel DP or further from the active region DA than the first dam part DM1). However, the invention is not limited thereto, and the display panel DP may include only one dam part disposed in the peripheral regions NDA1 and NDA2, or three or more dam parts. When a plurality of dam parts are included, the heights of the dam parts may be the same or different from each other.

In an embodiment, the display panel DP may include a protruding part BMP (e.g., protruding pattern or protruding member) disposed outside the dam parts DM1 and DM2. The protruding part BMP may be disposed in the second peripheral region NDA2. That is, the protruding part BMP may be disposed only in the second peripheral region NDA2, excluding the first peripheral region NDA1 adjacent to the pad region PDA. The protruding part BMP may be disposed adjacent to an edge DD-ED of the display device DD (e.g., outer edge).

Referring to FIG. 5, in an embodiment, the active region DA may have a tetragonal shape on a plane, the pad region PDA may be disposed at one side of the active region DA, and the protruding part BMP may be disposed to surround the outside of the active region DA, excluding the side of the active region DA at which the pad region PDA is disposed. That is, the protruding part BMP may be disposed in the second peripheral region NDA2 disposed outside the active region DA, and may be disposed to surround three sides of the active region DA having a tetragonal shape.

Referring to FIGS. 5 and 6, in an embodiment, the protruding part BMP may include a first portion BMP-M surrounding the outside of the active region DA, and a second portion BMP-S disposed between the first portion BMP-M and the dam parts DM1 and DM2 and further from the active region DA than the first portion BMP-M. The first portion BMP-M may extend in a direction parallel to an extension direction of the dam parts DM1 and DM2. The first portion BMP-M may be a portion, which is disposed outside the dam parts DM1 and DM2 and is continuously provided along the outside of the dam parts DM1 and DM2, excluding a portion adjacent to the pad region PDA. The second portion BMP-S may be a portion extending from the first portion BMP-M in a branch form, and be connected to or meet the dam parts DM1 and DM2. Each of a plurality of second portions BMP-S may extend from the first portion BMP-M, and the second portions BMP-S may be spaced apart from each other along the extension direction of the dam parts DM1 and DM2.

Figure 7:
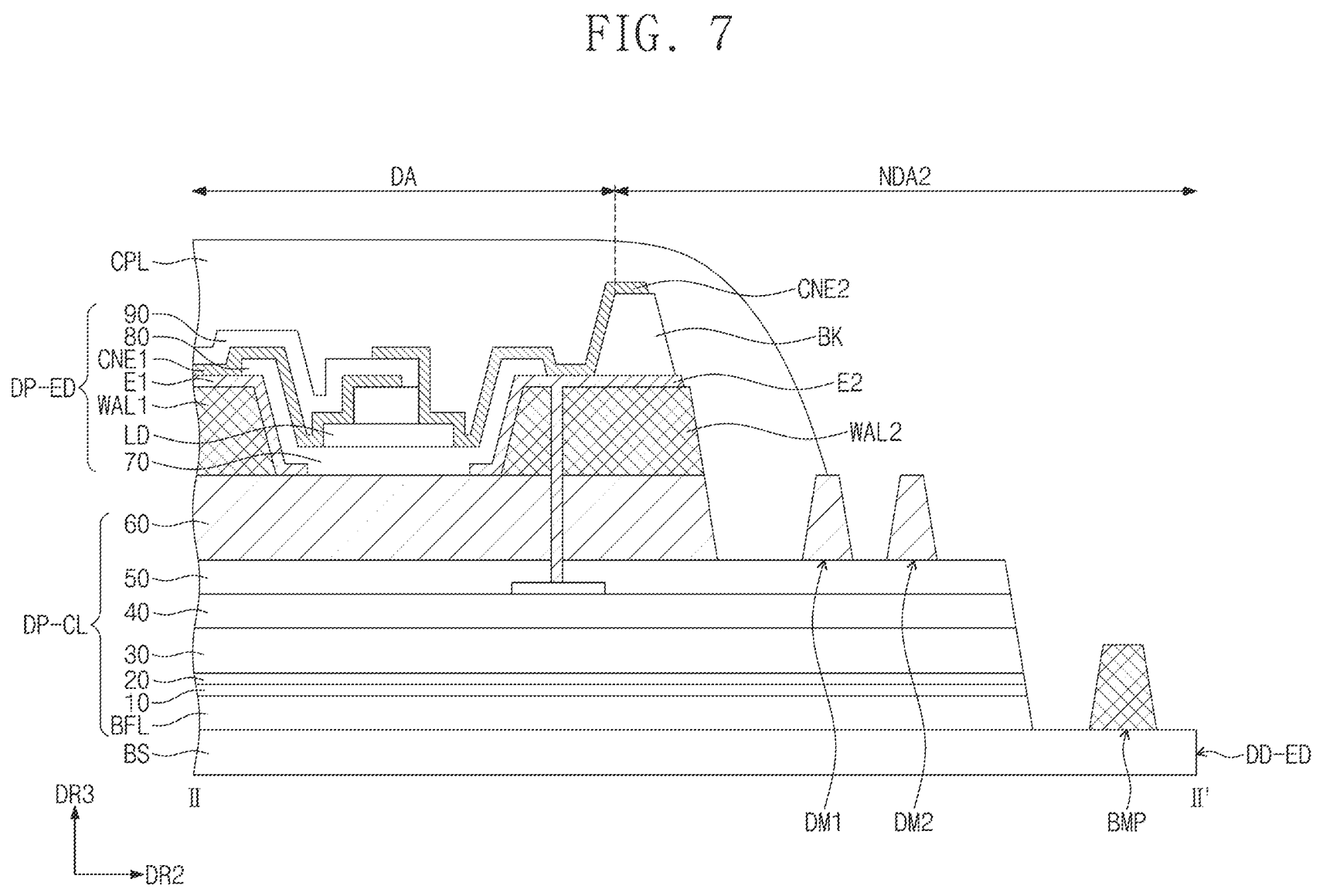
Figure 8:
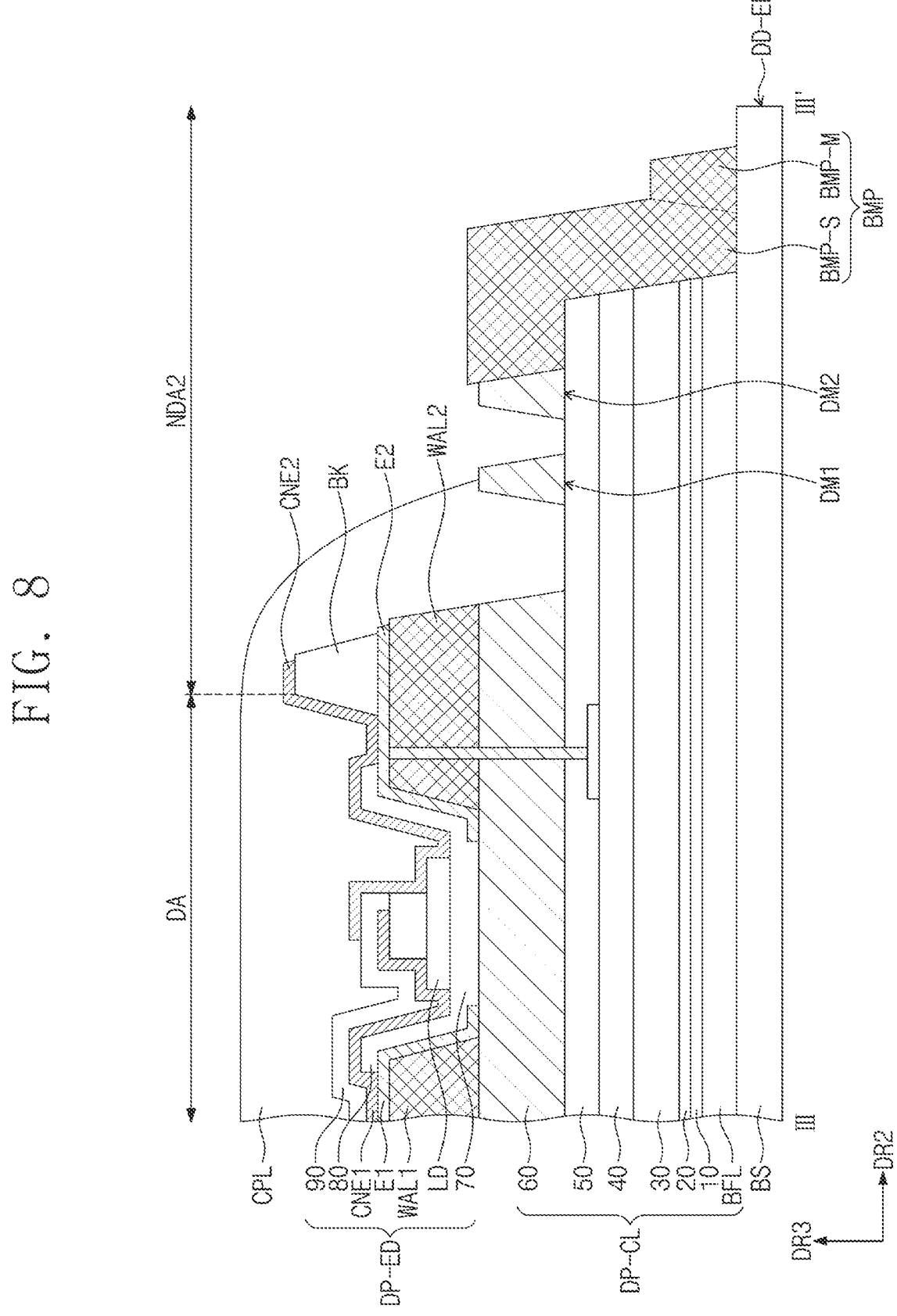
FIG. 8 is a cross-sectional view illustrating an embodiment of a portion of the display panel.

Each of FIGS. 7 and 8 is an enlarged cross-sectional view illustrating an embodiment of a portion of the display panel DP. FIG. 7 is a cross-sectional view corresponding to line II-II' of FIG. 6, and FIG. 8 is a cross-sectional view corresponding to line III-III' of FIG. 6.

Referring to FIGS. 7 and 8, the protruding part BMP may be disposed outside the dam parts DM1 and DM2, in the second peripheral region NDA2. The protruding part BMP may be disposed adjacent to the edge DD-ED of the display device DD. The protruding part BMP may be disposed on the base layer BS. The protruding part BMP may be disposed directly on the base layer BS. The protruding part BMP may be formed with polyimide.

The protruding part BMP may be formed in the same process as that of the sixth insulating layer 60 of the circuit layer DP-CL. In addition, the protruding part BMP may be formed in the same process as that of the barrier parts WAL1 and WAL2 of the light-emitting element layer DP-ED. In addition, unlike what is illustrated, the protruding part BMP may have a structure in which two or more layers are stacked. In an embodiment, for example, the protruding part BMP may include a lower layer formed in the same process as that of the sixth insulating layer 60, and an upper layer formed in the same process as that of the barrier parts WAL1 and WAL2.

The protruding part BMP may make it possible for a protective layer PT (see FIG. 15) provided in the method of manufacturing (or providing) the display device DD to be easily detached, and the protective layer PT (see FIG. 15) will be described later. As a detachment device is inserted between the upper surface of the protruding part BMP, and the protective layer PT (see FIG. 15), the protective layer PT (see FIG. 15) may be detached without damage to the display panel DP.

When the capping layer CPL is provided, the dam parts DM1 and DM2 may prevent a material for forming the capping layer CPL from flowing to the edge DD-ED of the display device DD. In an embodiment illustrated in FIGS. 7 and 8, the outer edge of the capping layer CPL which is furthest from the active region DA, is illustrated as being positioned on the first dam part DM1, but the invention is not limited thereto. In an embodiment, for example, the outer (or distal) edge of the capping layer CPL may be positioned inside the first dam part DM1, that is, closer to the active region DA than the first dam part DM1. In addition, the outer edge of the capping layer CPL may be positioned outside the first dam part DM1, that is, past the first dam part DM1 in a direction toward the edge DD-ED of the display device DD and adjacent to the second dam part DM2.

The dam parts DM1 and DM2 may be formed during the manufacturing process of the circuit layer DP-CL. In an embodiment, for example, the dam parts DM1 and DM2 may be disposed on the fifth insulating layer 50. In an embodiment, the dam parts DM1 and DM2 may be provided in the same process as that of providing the sixth insulating layer 60, and the sixth insulating layer 60, which is an organic insulating layer, provides a flat surface on which the light-emitting element layer DP-ED is provided. In an embodiment, one or more of the insulating layers 10 to 50 disposed under the dam parts DM1 and DM2 may be omitted.

FIG. 7 illustrates a portion of the protruding part BMP without the second portion BMP-S having a branch shape relative to the first portion BMP-M, and FIG. 8 illustrates a portion of the protruding part BMP including the second portion BMP-S having the branch shape.

The first portion BMP-M of the protruding part BMP may be spaced apart from the dam parts DM1 and DM2. The first portion BMP-M of the protruding part BMP may be provided to extend in an extension direction parallel with an extension direction (the first direction or the second direction) of the dam parts DM1 and DM2, outside the dam parts DM1 and DM2.

The second portion BMP-S of the protruding part BMP may be disposed between the first portion BMP-M and the dam parts DM1 and DM2. The second portion BMP-S of the protruding part BMP may extend from the first portion BMP-M and be connected to the dam parts DM1 and DM2, such as to meet a respective dam part or form an interface therewith. The second portion BMP-S may extend in an extension direction (the first direction or the second direction) of the dam parts DM1 and DM2 or in a direction different from the extension direction of the first portion BMP-M.

The first portion BMP-M and the second portion BMP-S of the protruding part BMP may be integrally formed. On a plane, the first portion BMP-M of the protruding part BMP may be continuously disposed in the second peripheral region NDA2, and a plurality of second portions BMP-S may be disposed to be spaced apart from each other along the first portion BMP-M. A spacing between the second portions BMP-S may be about 1 millimeter (mm) to about 2 millimeters (mm). However, the invention is not limited thereto, and the spacing between the second portions BMP-S may be random, different from the above range, different from or the same as each other, etc.

Figure 9A:
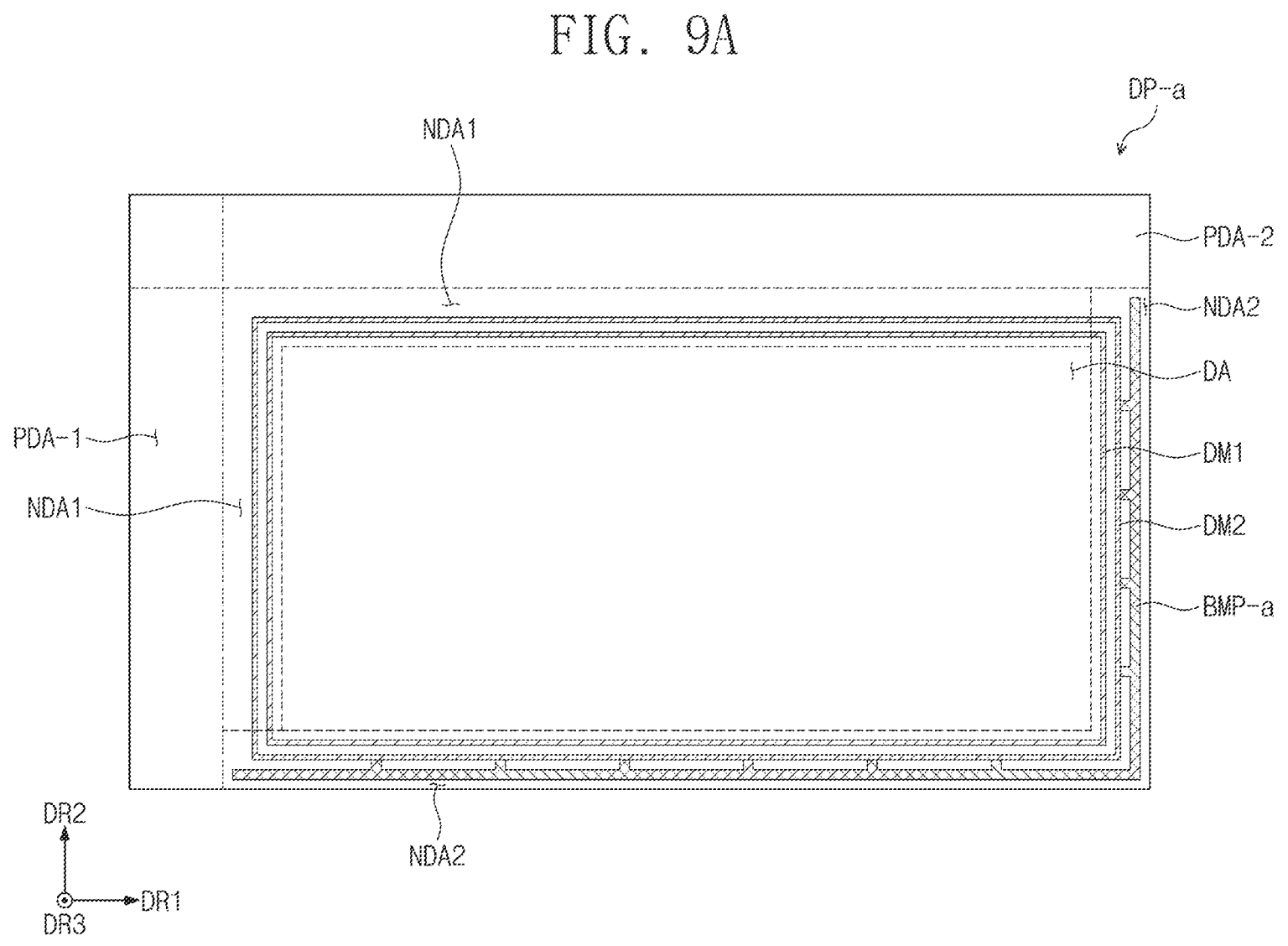
Figure 9B:
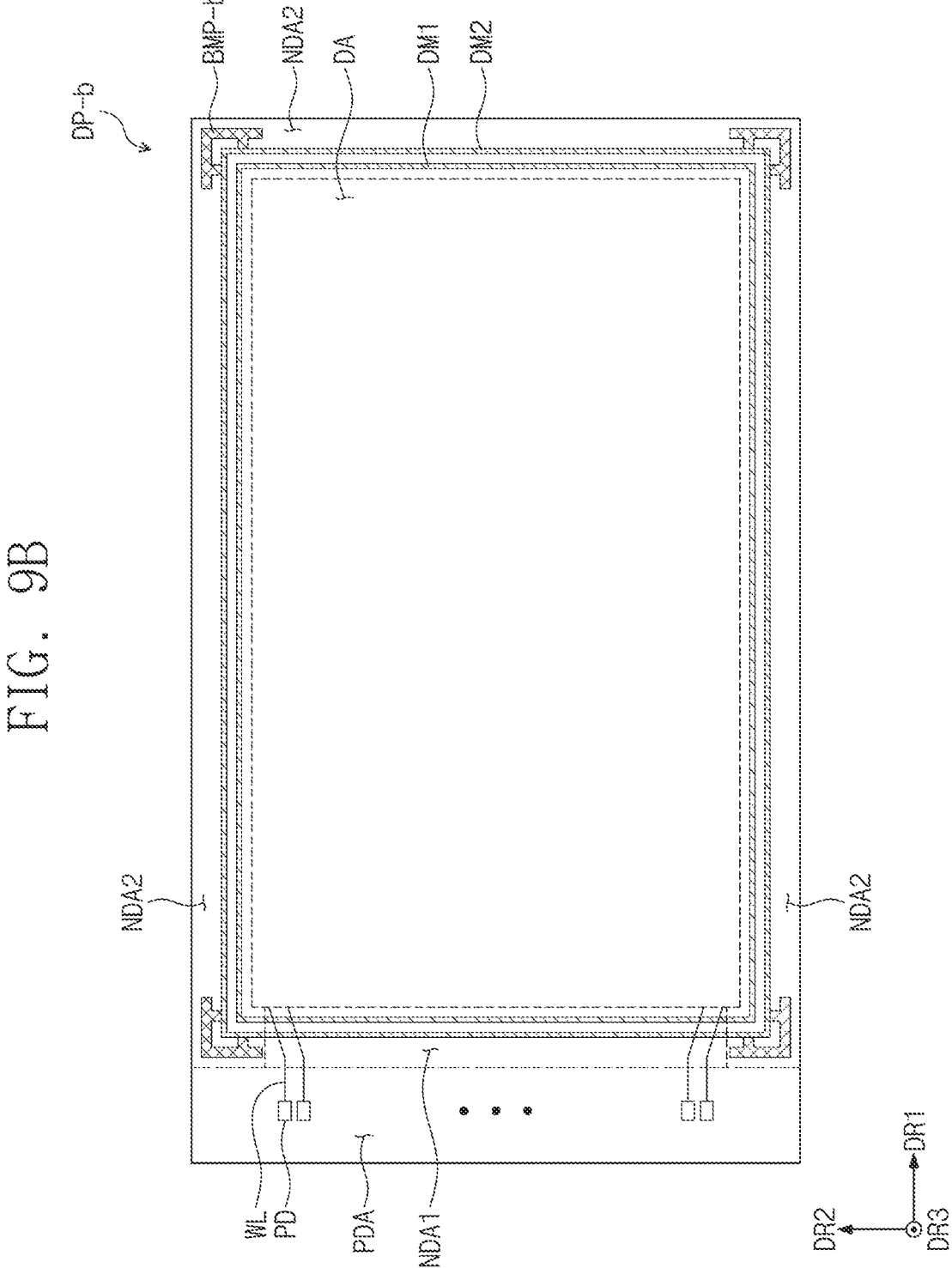
FIG. 9B is a plan view illustrating an embodiment of a display panel.
Figure 9C:
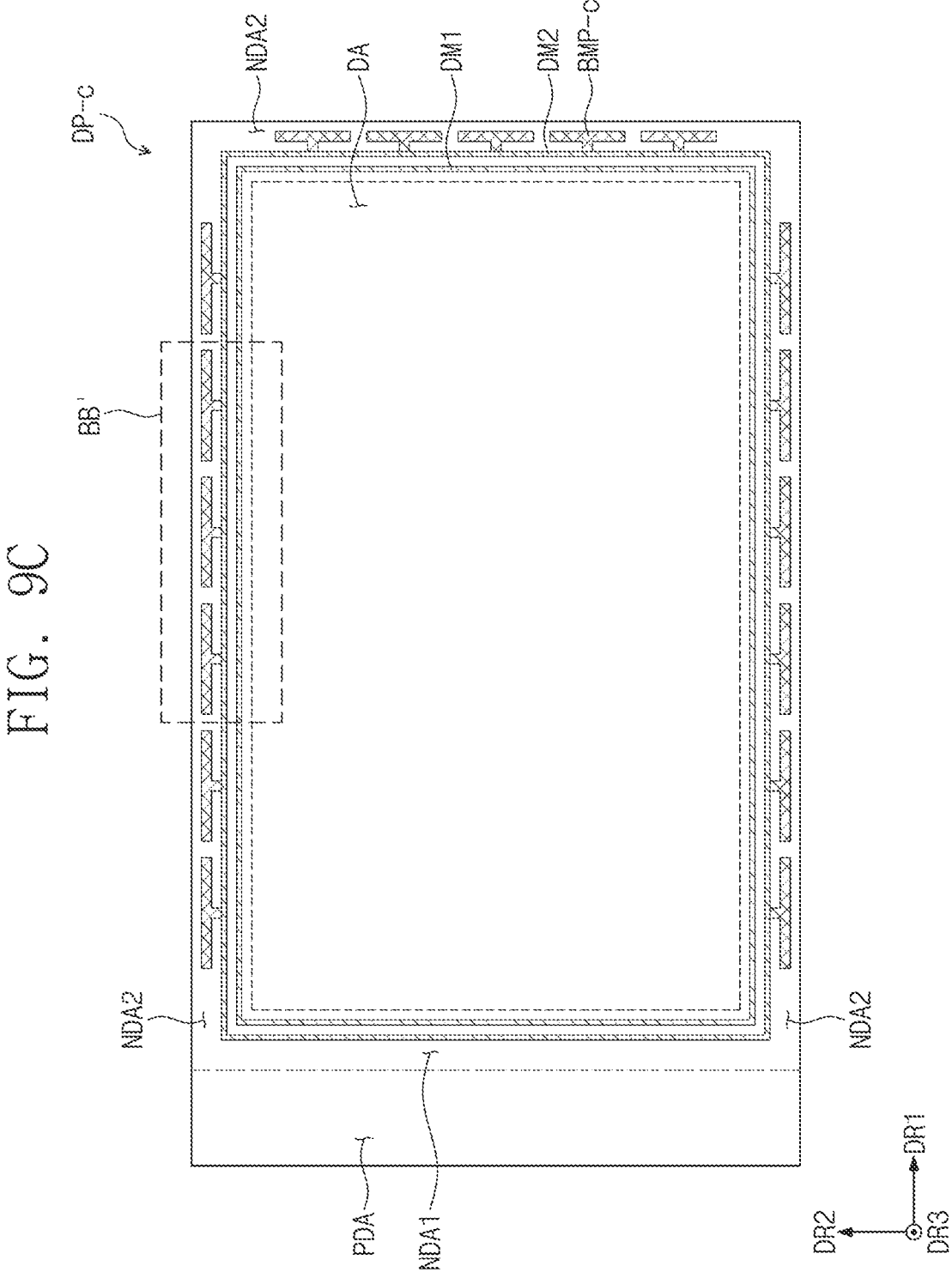
FIG. 9C is a plan view illustrating an embodiment of a display panel.
Figure 9D:
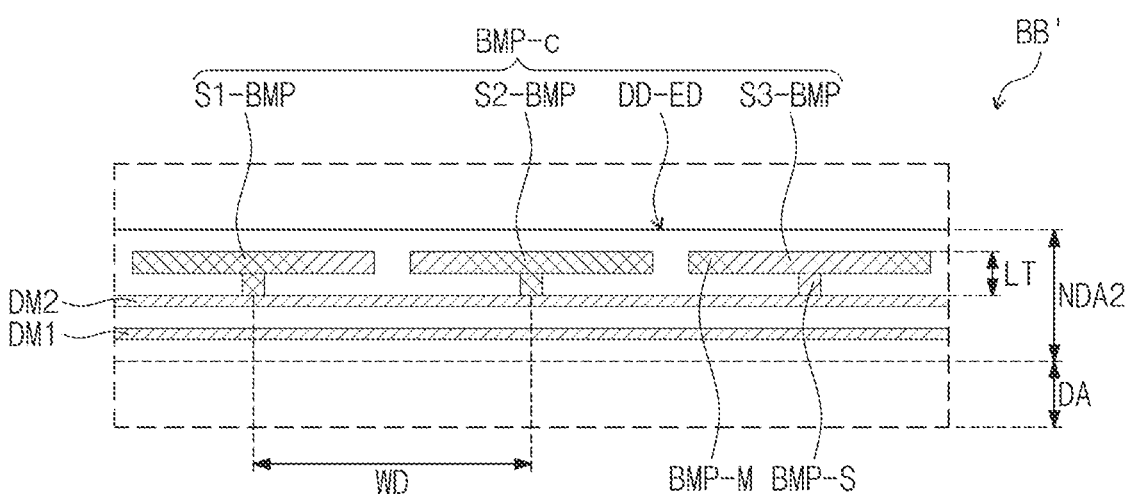
FIG. 9D is a plan view illustrating an embodiment of a portion of the display panel.

FIGS. 9A to 9C are plan views illustrating an embodiment of a display panel DP. FIG. 9D illustrates an embodiment of a portion of a display panel DP-c and is an enlarged plan view illustrating region BB' of FIG. 9C.

Referring to FIG. 9A, a display panel DR-a may include a plurality of pad regions PDA-1 and PDA-2. FIG. 9A illustrates the display panel DP-a including a first pad region PDA-1 and a second pad region PDA-2 which are respectively adjacent to two sides of the active region DA which meet each other at a corner of the active region DA.

In the display panel DP-a illustrated in FIG. 9A, a protruding part BMP-a may be disposed in the second peripheral region NDA2 which is not adjacent to the first pad region PDA-1 and the second pad region PDA-2. The protruding part BMP-a may be provided to surround the two sides of the active region DA as remaining sides of the active region DA along which the various pad regions do not extend. The protruding part BMP-a may include a first portion BMP-M and a second portion BMP-S as described with reference to FIG. 6 and the like.

The dam parts DM1 and DM2 may be disposed in the first peripheral region NDA1 and the second peripheral region NDA2. The protruding part BMP-a may be disposed outside the dam parts DM1 and DM2 in the second peripheral region NDA2.

FIG. 9A illustrates that the two pad regions PDA-1 and PDA-2 are respectively positioned on the left and upper sides of the active region DA on a plane defined by the first direction axis DR1 and the second direction axis DR2, but the invention is not limited thereto. In an embodiment, the display panel DP-a may include a plurality of pad regions including three pad regions, and even in the case of including two pad regions, the arrangement of the pad regions may be different from that illustrated in FIG. 9A. Even when the various pad regions are disposed in a shape different from that illustrated in FIG. 9A, the protruding part BMP-a may be provided in the remaining peripheral region, excluding the peripheral region adjacent to the pad regions. The protruding part BMP-a may be provided outside the dam parts DM1 and DM2 so that a protective layer PT applied to protect the display panel DP-a during a process of manu-facturing the display device DD may be easily removed by starting removal from a portion of the protective layer PT disposed on the protruding part BMP-a.

In a display panel DP-b illustrated in FIG. 9B, a plurality of protruding parts BMP-b may be respectively disposed at corner portions of the active region DA except for side portion of the active region DA which are between adjacent corner portions. In an embodiment, in the second peripheral region NDA2, excluding the first peripheral region NDA1 disposed between the pad region PDA and the active region DA, the protruding parts BMP-b may be disposed at the outer corner portions of the dam parts DM1 and DM2 and facing portions of the two dam parts which meet each other. The protruding parts BMP-b may be disposed not to overlap a pad PD provided in plural including a plurality of pads PD (e.g., a pad portion) and a line WL provided in plural including a plurality of lines WL (e.g., connecting lines), disposed in the pad region PDA and the first peripheral region NDA1. A portion of the protruding part BMP-b may be disposed to be connected to the dam parts DM1 and DM2 outside the dam parts DM1 and DM2. The protruding part BMP-b may include a first portion BMP-M and a second portion BMP-S as described with reference to FIG. 6 and the like. The protruding parts BMP-b include a plurality of first portions BMP-M which are disconnected from each other along a periphery of the dam parts.

Referring to FIGS. 9C and 9D, in a display panel DP-c, a protruding part BMP-c may be provided in a discontinuous form outside the active region DA. That is, the plurality of protruding parts BMP-c may include a plurality of first portions BMP-M which are disconnected from each other along a periphery of the active region DA and between corners thereof. The protruding part BMP-c may include a plurality of sub-protruding parts S1-BMP, S2-BMP, and S3-BMP disconnected from and spaced apart from each other. Each of the sub-protruding parts S1-BMP, S2-BMP, and S3-BMP may include a first portion BMP-M spaced apart from the dam parts DM1 and DM2, and a second portion BMP-S disposed between the dam parts DM1 and DM2, and the first portion BMP-M.

Referring to FIGS. 9C and 9D, each of the sub-protruding parts S1-BMP, S2-BMP, and S3-BMP may be provided to have a "T" shape on a plane. A length LT of the protruding part BMP-c taken from an outer edge of the second dam part DM2 may be about 1 mm or less. The length LT may be taken in a direction normal to the extension direction of the second dam part DM2. The length LT of the protruding part BMP-c may represent the entire dimension (e.g., maximum dimension) of the protruding part BMP-c in the direction from the active region DA to the edge DD-ED of the display device DD (e.g., a direction normal to the edge DD-ED). In addition, in an embodiment, a spacing WD between the sub-protruding parts S1-BMP, S2-BMP, and S3-BMP may be about 1 mm to about 2 mm. The spacing WD between the sub-protruding parts S1-BMP, S2-BMP, and S3-BMP may correspond to the spacing between the adjacent second portions BMP-S, such as from a center of the adjacent second portions BMP-S. The spacing may be taken in the extension direction of the second dam part DM2.

The display device DD according to one or more embodi-ment of the invention may include a protruding part BMP disposed on the base layer BS and outside the active region DA, so that a removable protective layer PT provided during a process of manufacturing the display panel DP may be easily detached from the display panel DP by starting removal of the protective layer PT, at the protruding part BMP. Thus, reliability of the method providing the display device DD, and of the display device DD provided thereby, is improved.

Hereinafter, an embodiment of a method of manufactur-ing (or providing) a display device DD will be described with reference to FIGS. 10A to 16. In the description of FIGS. 10A to 16, the same contents as those described in FIGS. 1 to 9D will not be described again, and differences will be mainly described.

Figure 10A:
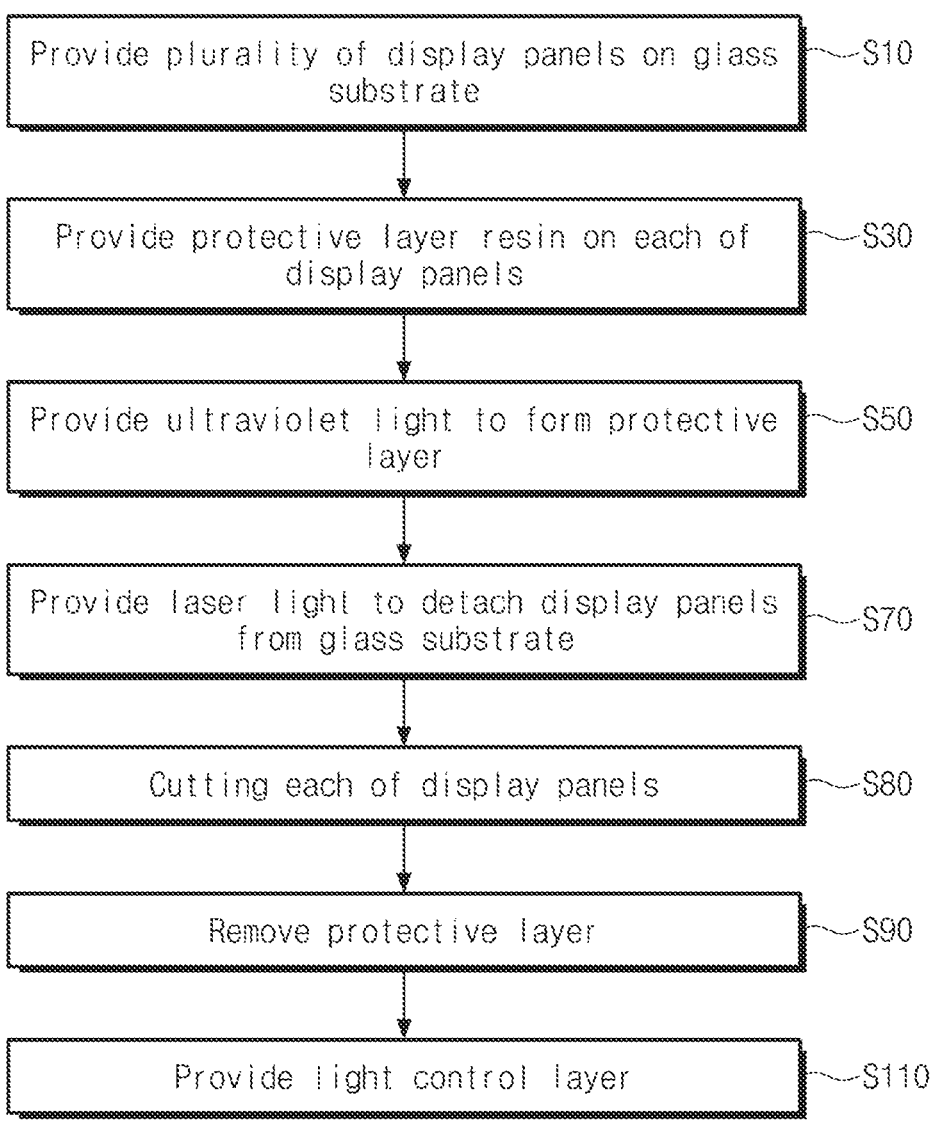
FIG. 10A is a flowchart illustrating an embodiment of a method of providing a display device.
Figure 10B:
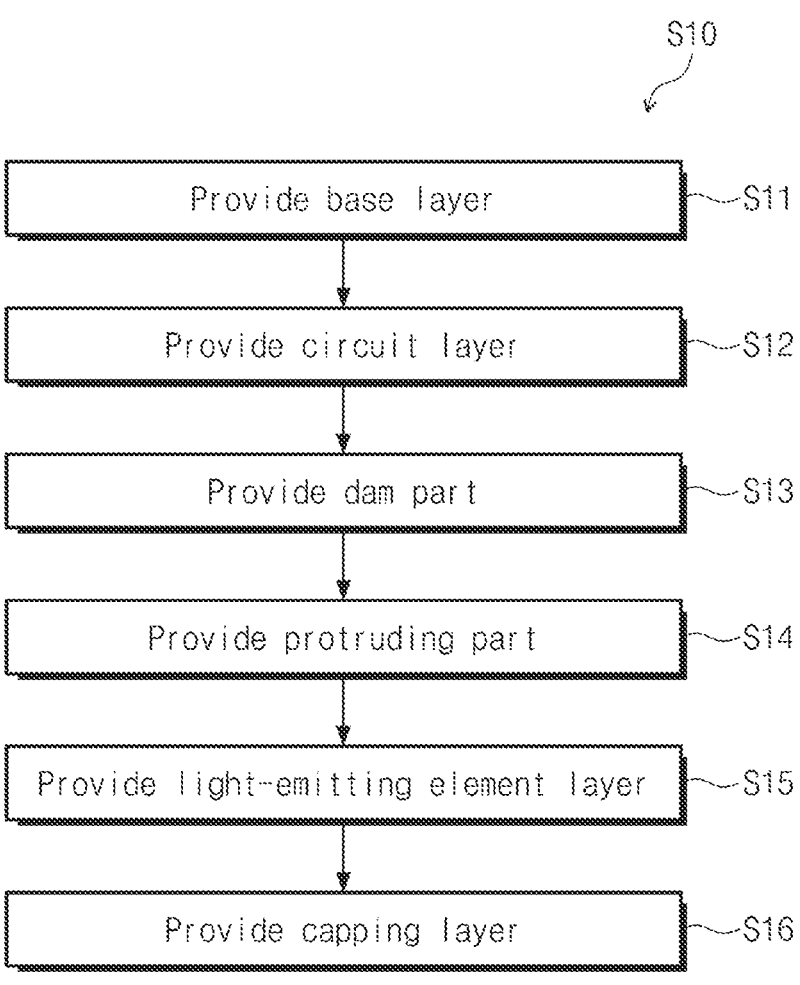
FIG. 10B is a flowchart illustrating an embodiment of a process of the method of providing a display device.
Figure 10C:
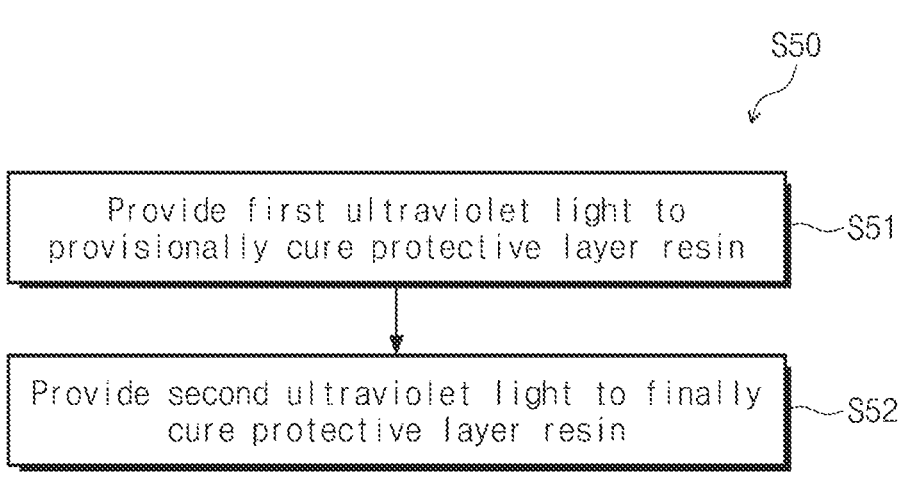
FIG. 10C is a flowchart illustrating an embodiment of a process of the method of providing a display device.

FIG. 10A is a flowchart illustrating an embodiment of a method of manufacturing (or providing) a display device DD. FIGS. 10B and 10C are flowcharts each illustrating an embodiment of a process in the method of manufacturing a display device DD.

Referring to FIG. 10A, the method of manufacturing a display device DD may include forming (or providing) a plurality of display panels P-DP (e.g., preliminary display panels) on a glass substrate BG (S10), providing a protective layer resin P-PT on each of the display panels P-DP (S30), providing ultraviolet light UV to form a protective layer PT (S50), providing laser light to detach the display panels P-DP from the glass substrate BG (S70), removing the protective layer PT (S90), and providing a light control layer CCL to each of the display panels P-DP (S110). In addition, the method of manufacturing a display device DD may further include separating of the display panels P-DP from each other (S80) between the detaching of the display panels P-DP from the glass substrate BG (S70) and the removing of the protective layer PT (S90).

Referring to FIG. 10B, the forming of the display panels P-DP (S10) may include providing a base layer BS (S11), forming a circuit layer DP-CL (S12), forming a dam part (S13), forming a protruding part BMP (S14), forming a light-emitting element layer DP-ED (S15), and forming a capping layer CPL (S16).

In an embodiment, the forming of the dam part (S13) may be performed in the same process as the forming of the circuit layer DP-CL (S12), or may be performed after the forming of the circuit layer DP-CL (S12). In addition, the forming of the protruding part BMP (S14) may be performed in the same process as the forming of the circuit layer DP-CL (S12), or may be performed after the forming of the circuit layer CP-CL (S12). The forming of the dam part (S13) and the forming of the protruding part BMP (S14) may be performed in a same process, or may be performed at different times, such as being sequentially performed. The forming of the dam part (S13) may be performed first, and the forming of the protruding part BMP (S14) may be performed later, or the forming of the protruding part BMP (S14) may be performed first and the forming of the dam part (S13) may be performed later.

Figure 11:
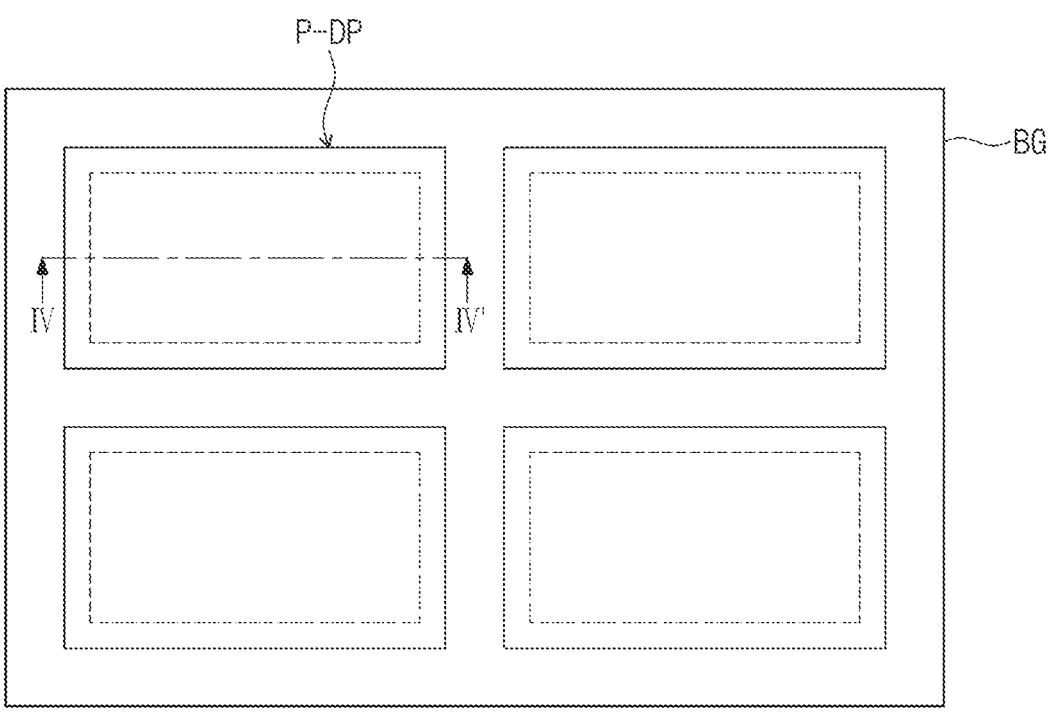
FIG. 11 schematically illustrates an embodiment of a process of the method of providing a display device.

FIG. 11 illustrates the forming of a plurality of display panels P-DP on a glass substrate BG (S10). The glass substrate BG may serve as a support substrate for supporting the structures (e.g., components, layers, etc.) of the display panels P-DP in a process of manufacturing the plurality of display panels P-DP. The plurality of display panels P-DP disposed on the glass substrate BG may be preliminary display panels before being separated from each other into respective display panels.

The forming of the display panels P-DP (S10) may include providing a base layer BS (S11). The base layer BS may include an active region DA, a pad region PDA disposed on at least one side of the active region DA, a first peripheral region NDA1 disposed between the active region DA and the pad region PDA, and a second peripheral region NDA2 disposed outside the active region DA and spaced apart from the pad region PDA. The base layer 135 may be a substrate containing polyimide.

The forming of the circuit layer DP-CL (S12) may include forming the circuit layer DP-CL including a thin film transistor and a plurality of insulating layers which are above the base layer BS. As described with reference to FIGS. 3 to 4B, the circuit layer DP-CL may include thin film transistors TR1 and TR2 and a plurality of insulating layers 10 to 60 which are stacked on the base layer BS.

In an embodiment, the forming of the dam part (S13) may be performed in the same process as a part of the forming of the circuit layer DP-CL (S12). The dam parts DM1 and DM2 together as a dam or dam member, may be provided outside the active region DA. The dam parts DM1 and DM2 may be provided in the first peripheral region NDA1 and the second peripheral region NDA2. In an embodiment, for example, the dam parts DM1 and DM2 may be formed in the same process as the forming of the sixth insulating layer 60 (see FIG. 4B) in the forming of the circuit layer DP-CL (S12). The dam parts DM1 and DM2 may be formed in the same process as the forming of the barrier parts WAL1 and WAL2 (FIG. 4B) which are provided in the forming of the light-emitting element layer DP-ED (S15). In addition, when the dam parts DM1 and DM2 have a stacked structure, the dam parts DM1 and DM2 may include a lower layer formed in a process during the forming of the circuit layer DP-CL (S12) and an upper layer formed in a process during the forming of the light-emitting element layer DP-ED (S15).

In an embodiment, the forming of the display panels P-DP (S10) may include forming the protruding part BMP (S14). The protruding part BMP may be disposed outside the dam parts DM1 and DM2 in the second peripheral region NDA2. The protruding part BMP may be formed on the base layer BS. In an embodiment, for example, the protruding part BMP may be formed in the same process as the forming of the sixth insulating layer 60 (FIG. 4B) in the forming of the circuit layer DP-CL (S12). The protruding part BMP may be formed in the same process as the forming of the barrier parts WAL1 and WAL2 (FIG. 4B) which are provided in the forming of the light-emitting element layer EP-ED (S15). The protruding part BMP may be formed directly on the base layer BS. The protruding part BMP may be formed of a polyimide material. However, there may be some differences in mechanical properties between the polyimide contained in the base layer BS and the polyimide which forms the protruding part BMP.

The forming of the light-emitting element layer DP-ED (S15) may include providing the barrier parts WAL1 and WAL2 (see FIG. 4B) and the light-emitting element LD (see FIG. 4B), above the circuit layer DP-CL.

After the forming of the light-emitting element layer DP-ED (S15), forming the capping layer CPL (S16) may be performed. The capping layer CPL may be formed of an organic material which is provided in a liquid form during a manufacturing process. When the capping layer CPL is provided as a liquid material, the flow of the liquid material for forming capping layer CPL along the base layer BS may be controlled by the dam parts DM1 and DM2.

A protective layer resin P-PT may be provided on each of the display panels P-DP including each of the base layer BS, the circuit layer DP-CL, the light-emitting element layer DP-ED, and the capping layer CPL stacked. The method of manufacturing (or providing) a display device DD may include providing a protective layer resin P-PT on each of the display panels P-DP (S30) and providing ultraviolet light UV to form a protective layer PT (S50).

Figure 12:
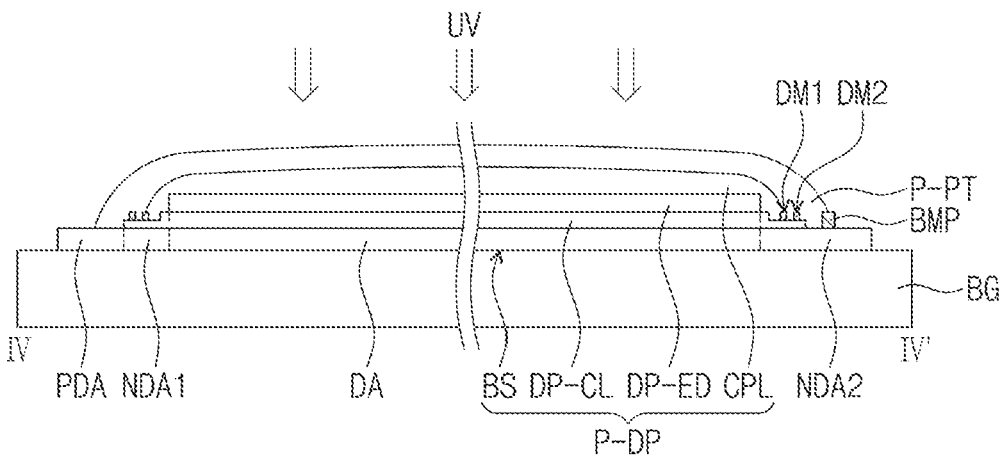
FIG. 12 schematically illustrates an embodiment of a process of the method of providing a display device.

FIG. 12 schematically illustrates providing ultraviolet light UV to form a protective layer PT (S50). The protective layer resin P-PT for forming the protective layer PT may be provided on each of the display panels P-DP, in a liquid form. The protective layer resin P-PT may be provided to cover an entirety of the capping layer CPL. The protective layer resin P-PT may be provided so that an outer edge thereof is positioned on the upper surface of the protruding part BMP (e.g., a surface which is furthest from the glass substrate BG and/or the base layer 135). In a portion in which the protruding part BMP is not disposed (e.g., excluding or adjacent to the protruding part BMP), the protective layer resin P-PT may be provided on the upper surface of the base layer BS or may be provided to cover a portion of the circuit layer DP-CL.

The protective layer resin P-PT may be provided in a liquid form, by using a coating method or a printing method. Unlike a conventional protective layer which is provided in a film form, the protective layer resin P-PT in a liquid form may be provided to cover various forms of display panels P-DP which are provided.

The protective layer resin P-PT may contain an acrylic resin. The protective layer resin P-PT may be provided to have an average thickness of about 50 micrometers (μm) to about 150 μm. The provided protective layer resin P-PT may be cured by ultraviolet light UV, to form a protective layer PT which is removably disposed on the display panels P-DP.

Ultraviolet light UV may be provided from above the protective layer resin P-PT, in a direction toward the glass substrate BG (or toward the base layer BS). The ultraviolet light UV may have a center wavelength of about 365 nanometers (nm) to about 395 nm.

Referring to FIG. 10C, the providing of ultraviolet light UV to form a protective layer PT (S50) may include providing first ultraviolet light to provisionally cure a protective layer resin P-PT (S51), and providing second ultraviolet light to finally cure the protective layer resin P-PT (S52) and provide the protective layer PT which is removably disposed on the display panels P-DP. That is, a first curing in which the first ultraviolet light is provided to provisionally cure a protective layer resin P-PT and a second curing in which the second ultraviolet light is provided to the provisionally cured protective layer resin to finally cure the protective layer resin P-PT and provide the protective layer PT, may be sequentially performed. Light of the same wavelength range may be used for the first ultraviolet light and the second ultraviolet light. In an embodiment, for example, the center wavelength of each of the first ultraviolet light and the second ultraviolet light may be about 365 nm. However, the invention is not limited thereto, and the first ultraviolet light and the second ultraviolet light may have different center wavelengths.

In addition, the providing of ultraviolet light UV from above the protective layer resin P-PT to form a protective layer PT (S50) may be performed in one process without distinction between the provisional curing step and the final curing step. A protective layer PT as a temporary protective layer which is removable from the display panels P-DP (see FIG. 13) may be provided to correspond to an upper portion of each of the display panels P-DP.

Figure 13:
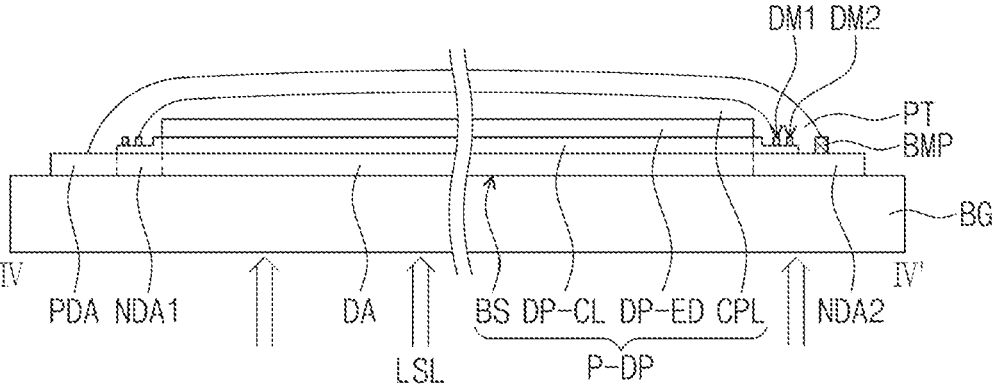
FIG. 13 schematically illustrates an embodiment of a process of the method of providing a display device.

One or more embodiment of the method of manufacturing a display device DD may include providing ultraviolet light UV to form the protective layer PT (S50) and providing laser light to detach the display panels P-DP from the glass substrate BG (S70). FIG. 13 schematically illustrates irradiating laser light LSL to detach the display panels P-DP from the glass substrate BG. The laser light LSL may be irradiated from below the glass substrate BG and in a direction from the glass substrate BG to the protective layer PT. A bond between the glass substrate BG and the base layer BS may be weakened or broken by the laser light LSL. After irradiation with the laser light LSL, the glass substrate BG and the base layer BS may be separated from each other. That is, the glass substrate BG is removably disposed with each of the display panels P-DP. While the glass substrate BG and the base layer BS are separated by irradiating the laser light LSL, the protective layer PT may cover and protect the upper portions of the display panels P-DP as separated display panels.

After separating the base layer BS from the glass substrate BG, separating of the display panels (S80) may be performed. The separation of each of the display panels P-DP (S80) may be performed for the display panels P-DP each including the protective layer PT (e.g., in a state in which the protective layer PT is stacked). The separating of each of the display panels P-DP (S80) may be performed between a process of detaching the display panels P-DP from the glass substrate BG (S70) and a process of removing of the protective layer PT from the display panels P-DP (S90).

Figure 14:
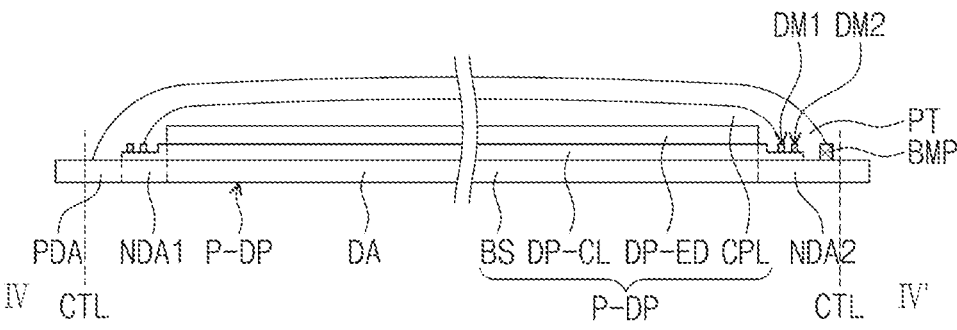
FIG. 14 schematically illustrates an embodiment of a process of the method of providing a display device.

FIG. 14 schematically illustrates the cutting of each of the display panels P-DP to separate a display panel DP from a remaining portion of the display panels P-DP (S80). The cutting of each of the display panels P-DP (S80) may include removing portions of some components such as the base layer BS in each of the display panels P-DP, along a cutting line CTL so as to match the size and shape of a final product of the display panel DP. The cutting line CTL may correspond to the edge DD-ED of the display panel DP. After cutting each of the display panels P-DP (S80), the display panels P-DP (specifically, preliminary display panels) may be processed and prepared to have the shape of final display panels DP. In the cutting of each of the display panels P-DP (S80), the protective layer PT may remain attached on the display panels P-DP so as to protect the display panels P-DP during the cutting process.

Figure 15:
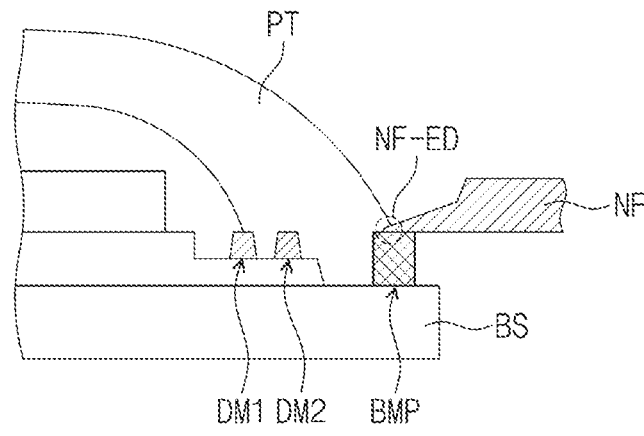
FIG. 15 schematically illustrates an embodiment of a process of the method of providing a display device.

After providing laser light LSL to detach the display panels P-DP from the glass substrate BG (S70), the removing of the protective layer PT (S90) may be performed. FIG. 15 exemplarily illustrates the removing of the protective layer PT (S90). The removing of the protective layer PT (S90) may include detaching the protective layer PT disposed on the display panel DP (FIG. 16) by using a detachment device NF. The removing of the protective layer PT which is removably attached to the display panels P-DP (S90) may include removing the protective layer PT by inserting the detachment device NF between the upper surface of the protruding part BMP and the protective layer PT, that is, at an interface between the protruding part BMP and the protective layer PT. The interface may correspond to a boundary between the protruding part BMP and the protective layer PT which is furthest from the active region DA (or closest to the edge DD-ED).

In an embodiment, the detachment device NF may be a knife having an edge portion NF-ED at a distal end of the detachment device NF, which is inserted between the upper surface of the protruding part BMP and the protective layer PT. The edge portion NF-ED of the detachment device NF may include a curved portion having a radius of curvature of about 1 mm to about 2 mm. The radius of curvature of the edge portion NF-ED of the detachment device NF and the length LT of the protruding part BMP (see FIG. 9D), or the spacings WD of the protruding parts BMP may correspond to each other. However, the invention is not limited thereto.

FIG. 15 illustrates that one detachment device NF is inserted between the protruding part BMP and the protective layer PT, but the invention is not limited thereto. Detachment of the protective layer PT may occur simultaneously at different portions of the protruding part BMP, by using a plurality of detachment device NF. In addition, the protective layer PT may be sequentially detached from different portions of the protruding part BMP by using one detachment device NF.

Figure 16:
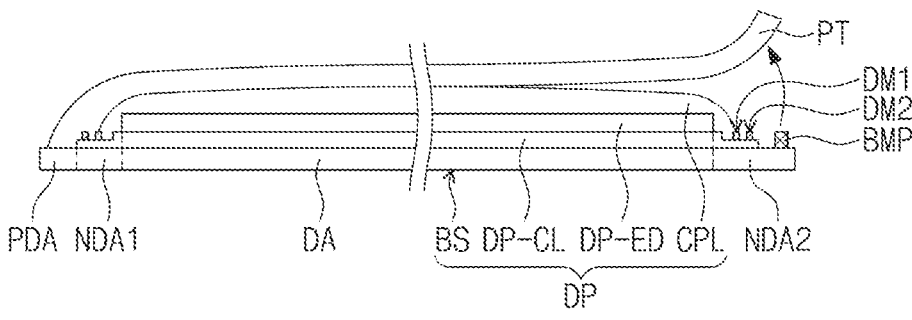
FIG. 16 schematically illustrates an embodiment of a process of the method of providing a display device.

FIG. 16 schematically illustrates the removing of the protective layer PT from the display panel DP (S90). The protective layer PT may be easily removed by first removing a portion thereof at the protruding part BMP, and then further removing a remainder thereof in a direction toward the active region DA.

Referring to FIG. 10A, the method of manufacturing a display device DD may include removing a protective layer PT (S90) and providing a light control layer CCL (S110). The providing of the light control layer CCL (S110) may include disposing the light control layer CCL (FIG. 4B) on the base substrate BL (see FIG. 4B) and then on the display panel DP, or providing the light control layer CCL (see FIG. 4B) directly on the display panel DP.

Although not illustrated, in one or more embodiment of the method of manufacturing a display device DD, a module process of attaching a circuit board or the like to the display panel DP, may be performed after removing a protective layer PT from the display panel DP (S90).

One or more embodiment of the method of manufacturing a display device DD may protect various types of display panels P-DP since the method includes providing a liquid-type protective layer resin P-PT to form a protective layer PT during a manufacturing process of a display panel DP of the display device DD. In addition, one or more embodiment of the method of manufacturing a display device DD may provide easy detachment of the protective layer PT from the display panel DP and be used for manufacturing a display device DD with improved reliability, by forming a protruding part BMP disposed on a base layer BS and outside an active region DA and positioning the outer edge of the protective layer resin P-PT on the protruding part BMP.

By including a protective layer resin P-PT provided on an upper portion of a display panel DP and forming a protective layer PT by curing the protective layer resin P-PT, one or more embodiment of the method of manufacturing a display device DD may have the effect of easily protecting various shapes of display panels P-DP during a manufacturing process thereof, when compared to the case of processing a conventional film-type protective layer and providing the conventional protective layer on display panels P-DP. In addition, since one or more embodiment of the method of manufacturing a display device DD includes forming a protruding part BMP on the base layer BS of a display panel DP, the method may provide easy removal of the provided protective layer PT without damage to the display panel DP, by providing initial detachment of the protective layer PT at the upper surface of the protruding part BMP in the process of removing the protective layer PT from the display panel DP.

In addition, since a display device DD is manufactured by one or more embodiment of the method of manufacturing a display device DD includes a protruding part BMP disposed on the base layer BS and outside the active region DA, a protective layer PT provided during a manufacturing process of the display device DD may be easily detached from the protruding part BMP, thus exhibiting improved reliability characteristics.

By including a protruding part BMP disposed on the base layer BS and outside the active region DA, one or more embodiment may provide a display device DD from which a protective layer PT attached thereto during a process is easily removed.

By including providing a liquid-type protective layer resin P-PT and forming a protective layer PT by curing the protective layer resin P-PT, one or more embodiment may provide a method of manufacturing a display device DD having improved reliability.

Although the above has been described with reference to embodiments of the invention, those skilled in the art or those of ordinary skill in the art will understand that the invention may be variously modified and changed within the scope not departing from the spirit and technical scope of the invention described in the claims to be described later.

Therefore, the technical scope of the invention should not be limited to the contents described in the detailed description of the specification, but should be determined by the claims below.

What is claimed is:

1. A method for providing an electronic device, the method comprising:
   providing a plurality of display panels removably disposed on a substrate;
   providing a protective layer which includes a protective layer resin and is removably disposed on the display panels;
   removing the protective layer from the display panels, to provide final display panels from which the protective layer is removed; and
   providing a light control layer to each of the final display panels to provide a display device of the electronic device.

2. The method of claim 1, wherein the providing of the plurality of display panels comprises:

providing a base layer comprising an active region, a pad region adjacent to the active region, a first peripheral region between the active region and the pad region, and a second peripheral region which is outside the active region, adjacent to the first peripheral region and spaced apart from the pad region;
   providing in order from the base layer, a circuit layer comprising a thin film transistor, an insulating layer and a light-emitting element layer; and
   providing on the base layer, each of:
      a dam part which extends along the active region, in the first peripheral region and the second peripheral region; and
      a protruding part which is further from the active region than the dam part, in the second peripheral region.

3. The method of claim 2, wherein the providing the protective layer comprises providing the protective layer resin on each of the display panels, the protective layer resin having an outer edge furthest from the active region and corresponding to the protruding part which is further from the active region than the dam part.

4. The method of claim 1, wherein the protective layer resin comprises an acrylic resin.

5. The method of claim 1, wherein the providing the protective layer comprises:
   providing the protective layer resin on each of the display panels, and
   providing an ultraviolet light to the protective layer resin,
   wherein the ultraviolet light has a center wavelength of about 365 nanometers to about 395 nanometers.

6. The method of claim 1, wherein the providing of the protective layer comprises:
   providing the protective layer resin on each of the display panels;
   first curing the protective layer resin, to provisionally cure the protective layer resin; and
   second curing the protective layer resin which is provisionally cured, to finally cure the protective layer resin and form the protective layer.

7. The method of claim 2, wherein
   the protective layer has an outer edge which is furthest from the active region and contacts the protruding part at an area of the protective layer which is adjacent to the outer edge, and
   the removing the protective layer from the display panels comprises initial detachment of the protective layer from the display panels, at the area of the protective layer which is adjacent to the outer edge.

8. The method of claim 1, further comprising between the providing of the protective layer on the display panels and the removing of the protective layer from the display panels:
   removing the display panels together with the protective layer, from the substrate, and
   cutting each of display panels which is removed from the substrate.

* * * * *